US005831660A

United States Patent [19]

Kubo et al.

[11] Patent Number: 5,831,660

[45] Date of Patent: Nov. 3, 1998

[54] ELECTROSTATIC RECORDING HEAD

[75] Inventors: Shun-ichi Kubo, Tokyo; Fumitaka Ozeki, Hino; Takuo Nogami, Hachioji; Shigeru Komiyama, Okaya, all of Japan

[73] Assignee: Olympus Optical Co., Ltd., Tokyo, Japan

[21] Appl. No.: 576,946

[22] Filed: Dec. 22, 1995

[30] Foreign Application Priority Data

Jan. 18, 1995 [JP] Japan .................................... 7-005620

[51] Int. Cl.[6] ............................ B41J 2/45; H01L 27/148; H01L 29/768

[52] U.S. Cl. ............................................ 347/238; 257/234

[58] Field of Search ..................................... 347/238, 239, 347/42; 250/208.1, 578.1; 257/234, 88

[56] References Cited

U.S. PATENT DOCUMENTS

| | | | |
|---|---|---|---|
| 4,160,257 | 7/1979 | Carrish | 347/127 |
| 4,195,927 | 4/1980 | Fotland et al. | 399/154 |
| 4,267,556 | 5/1981 | Fotland et al. | 347/127 |
| 4,365,549 | 12/1982 | Fotland et al. | 347/127 |
| 4,679,060 | 7/1987 | McCallum et al. | 347/120 |
| 5,258,778 | 11/1993 | Creutzmann et al. | 347/238 |
| 5,307,089 | 4/1994 | Takasu et al. | 347/238 |

FOREIGN PATENT DOCUMENTS

| | | |
|---|---|---|
| 61-185879 | 8/1986 | Japan . |
| 2-62862 | 12/1990 | Japan . |
| 4-238056 | 8/1992 | Japan . |
| 6-99610 | 4/1994 | Japan . |

*Primary Examiner*—N. Le
*Assistant Examiner*—Thinh Nguyen
*Attorney, Agent, or Firm*—Frishauf, Holtz, Goodman, Langer & Chick

[57] ABSTRACT

An electrostatic recording head includes a plurality of elongated head chips fixed on a head base in a linear alignment along their longitudinal direction. The head chip has a dielectric layer, a plurality of line electrodes provided on one surface of the dielectric layer and extending at predetermined intervals in the longitudinal direction, and a plurality of finger electrodes provided on one surface of the dielectric layer and arranged to cross the line electrodes to together form a matrix. A control electrode or electrodes are provided to face the finger electrodes through an insulator layer. The finger electrodes extend parallel to an end face of the head chip.

5 Claims, 25 Drawing Sheets

ELECTROSTATIC RECORDING HEAD

BACKGROUND OF THE INVENTION

1. Field of the Invention

The present invention relates to an ion flow type electrostatic recording head which performs electrostatic recording by irradiating a recording member such as a dielectric body with charged particles of an ion flow or an electron beam.

2. Description of the Related Art

As an electrostatic recording head of this type, those disclosed in, e.g., Jpn. Pat. Appln. KOKOKU Publication No. 2-62862 and U.S. Pat. No. 4,679,060 are conventionally known. In each of these heads, a plurality of linear or band-like induction electrodes or line electrodes extending in the longitudinal direction of the recording head and a plurality of linear or band-like discharge electrodes or finger electrodes extending in a direction crossing the longitudinal direction are arranged in a matrix manner so as to oppose each other via a dielectric layer, and holes for generating charged particles are formed in portions corresponding to the individual matrix intersections of the discharge electrodes. This construction forms a charged particle generating section. Also, a control electrode or electrodes in which a plurality of holes corresponding to the holes in the discharge electrodes are formed are provided to oppose the discharge electrodes via an insulator layer, thereby forming a charged particle control section. The surface of a recording medium is irradiated with charged particles through the holes in the control electrode. In an electrostatic recording head of this type, an AC voltage is applied between a selected induction electrode and discharge electrode to induce corona discharge near a hole in the discharge electrode corresponding to the matrix intersection of the two electrodes, thereby generating charged particles. The charged particles are extracted and accelerated toward the control electrode by a control voltage applied between the discharge electrode and the control electrode. The accelerated charged particles are emitted from a hole formed in the control electrode toward a recording member. An acceleration voltage for forming an acceleration field is applied between the control electrode and the recording member. This electric field allows the charged particles emitted from the hole in the control electrode to reach the surface of the recording member, forming an electrostatic charge pattern. As described in U.S. Pat. No. 4,679,060, these conventional electrostatic recording heads are manufactured as follows. Metal foils attached to the opposite surfaces of a dielectric substrate are patterned into line electrode and finger electrodes by a photoetching process, thereby forming a charge particle generating section. Alternately, line electrodes and finger electrodes formed by photoetching two metal foils into a predetermined pattern are bonded and stacked on the opposite surfaces of a dielectric layer made from, e.g., natural mica or a resin paste having dielectric characteristics, thereby forming a charged particle generating section. Additionally, an insulating film is attached to the charged particle generating portion and patterned into a desired shape to form an insulator layer. A charged particle control portion is manufactured by bonding and stacking a control electrode formed by a photoetching process on this insulator layer, thereby completing an electrostatic recording head. In this construction, the parameters of the recording head, such as the numbers of induction and discharge electrodes forming the matrix and the sizes of holes formed in the discharge electrodes and the control electrode, are set in accordance with the recording density and the recording dot size of images to be formed, the driving method, and the like factor. The thicknesses of the electrodes, the dielectric layer, and the insulator layer are determined by taking account of, e.g., desired electrical characteristics and a particular manufacturing method to be used.

Recently, manufacturing methods aiming at improving the performance of a recording head have attracted attention instead of the conventional electrostatic recording head manufacturing method described above. In these methods, as disclosed in Jpn. Pat. Appln. KOKAI Publication Nos. 61-185879 and 4-238056, for example, an electrostatic recording head with the above construction is manufactured by applying a thin-film manufacturing technology or a thick-film printing technology as a semiconductor fabrication technology.

The former publication shows manufacturing steps in which a thin-film induction electrode pattern is formed on an insulating substrate by vapor deposition or the like process. A dielectric layer and a discharge electrode pattern are formed in sequence on this induction electrode pattern by vapor deposition. Alternatively, induction electrodes and discharge electrodes are formed on the two sides of a dielectric by, e.g., vapor deposition. In this manner a charged particle generating section is formed. An insulator layer and a control electrode are stacked and bonded on top of this charged particle generating section in the same fashion as in the above conventional method, thereby manufacturing an electrostatic recording head. The latter publication discloses a method of manufacturing a completely solid state electrostatic recording head, in which a dielectric layer or discharge electrodes are formed by using the thick-film printing technology and combined with induction electrodes or discharge electrodes formed by vapor deposition or the like process. The latter publication also discloses a method of improving the durability by forming a dielectric layer in the form of a composite layer provided with a surface layer having resistance to a discharge product. Furthermore, the latter publication shows the relationship between the thickness of the dielectric layer and the width of a hole in the discharge electrode and the relationship between the thickness and the hole width of the discharge electrode as conditions by which charged particles are efficiently generated.

Jpn. Pat. Appln. KOKAI Publication No. 6-99610 discloses a method in which individual electrode layers, a dielectric layer, and an insulator layer are formed by printing on a substrate formed by sintering a ceramic green sheet and are integrally sintered, thereby manufacturing an electrostatic recording head. In this method, a plurality of short, partial recording heads are manufactured in a portion of the green sheet in which a dimensional change during sintering is small. These recording heads are then connected to form a recording head, and in this manner a decrease in the accuracy is prevented.

Unfortunately, it is difficult to manufacture a recording head for high-resolution recording or a long recording head for increasing the recording width or to simultaneously realize the both in accordance with the constructions and the manufacturing methods of the electrostatic recording heads disclosed in these conventional methods, since structural and manufacturing problems to be described below arise.

To increase the resolution of an electrostatic recording head for high-resolution image recording, it is necessary to decrease the size of recording dots formed by the recording head and arrange these recording dots at a high density corresponding to a desired resolution. In order for an electrostatic recording head to meet these demands, it is necessary to narrow the width of an induction electrode in accordance with the decreased size of recording dots and decrease the size of holes formed in discharge electrodes and a control electrode. To increase the array density of recording dots, it is also necessary to narrow the array pitch of induction and discharge electrodes and decrease the array pitch of holes formed in these electrodes. The induction electrodes and the discharge electrodes consist of a plurality of discrete electrodes arranged in a matrix manner. Therefore, to increase the resolution of the recording head, patterns of these discrete electrodes must be formed with a high definition.

In the conventional structures and manufacturing methods disclosed in Jpn. Pat. Appln. KOKOKU Publication No. 2-62862 and U.S. Pat. No. 4,679,060, a portion which forms electrodes in an electrostatic recording head is formed by a processing method which is primarily done by chemical etching. This limits miniaturization of holes capable of being formed in the electrodes. That is, it is generally difficult for chemical etching to form holes of a size smaller than the thickness of an electrode material. This limits miniaturization of holes and improvement of resolution. Note that the limit size of holes capable of being formed can be decreased to some extent by decreasing the thickness of an electrode material. However, this method is difficult to practice because it is extremely difficult to handle thin electrodes.

As the size of holes in electrodes is decreased and the array density of the holes is increased, a higher assembly accuracy is required to position these electrodes with a high accuracy via a dielectric layer and an insulator layer and bond and stack the electrodes. In the conventional manufacturing methods described previously, it is necessary to assemble a recording head while maintaining a desired accuracy throughout the length of the recording head. Consequently, the assembly itself is difficult to perform. Additionally, since it is necessary to handle very thin parts with fine shapes, the difficulty of the work is undesirably increased also in respect of parts handling.

Furthermore, manufacturing a long recording head leads to elongation in parts forming electrodes, a dielectric layer, and an insulator layer which constitute the recording head. Consequently, a large-scale installation is required to manufacture these parts. Additionally, combining these long parts makes a high assembly accuracy difficult to maintain, and handling of the parts is made more difficult. These various problems make a recording head for high-resolution recording hard to realize.

For these reasons, the upper-limit recording density of ion flow type electrostatic recording heads which have been conventionally put into practical use is 300 to 400 D.P.I. (Dot Per Inch), and almost no recording heads have achieved a high resolution of 600 D.P.I. or higher. The recording width also is around the A4 vertical size (210 mm) in most recording heads. Furthermore, individual parts of electrodes, a dielectric layer, and an insulator layer constituting an electrostatic recording head must have sizes large enough to facilitate handling during processing and assembly; i.e., these parts cannot be miniaturized. This makes miniaturization of an electrostatic recording head difficult.

On the other hand, the electrostatic recording head manufacturing method disclosed in Jpn. Pat. Appln. KOKAI Publication No. 4-238056 in which only a dielectric layer or a dielectric layer and discharge electrodes are formed by the thick-film printing technology has the following problems in increasing the resolution and the length of a recording head.

That is, since the formation accuracy of a pattern formed by thick-film printing is limited, it is difficult to form high-definition electrode shapes and small holes. This makes it difficult to form fine holes meeting a high resolution and arrange discharge electrodes at a high density. Also, the recording head manufacturing process involves both a thin-film formation step and a thick-film printing step, i.e., the process is not a consistent thin-film manufacturing process. The result is that the manufacturing steps are complicated and a large number of manufacturing installations are necessary. On the other hand, if only a dielectric layer is formed by the thick-film printing technology and fine patterns of discharge electrodes and holes are formed on the dielectric layer by the thin-film manufacturing technology, a low surface accuracy of the thick dielectric layer unavoidably forms considerable unevenness corresponding to the thickness of the thin film on the surface of the dielectric layer. Consequently, discharge electrodes cannot be stably formed. This results in difficulty in the manufacture of a recording head. Additionally, the distance between the edge of each hole in the discharge electrode and the induction electrode varies between holes or in the same hole. This may result in an unstable generation of charged particles.

Also, manufacturing a recording head with a large length by this method requires a large thin-film manufacturing installation and a large thick-film printing installation meeting the length of the recording head. This undesirably increases the size and complexity of the manufacturing installations. Furthermore, it becomes very difficult to form a dielectric layer or discharge electrodes throughout the large length without any defects. Consequently, the yield in each manufacturing step largely decreases. For these reasons, this manufacturing method cannot be put into practical use.

The method of manufacturing an electrostatic recording head by using the thin-film manufacturing technology as one semiconductor manufacturing technology, disclosed in Jpn. Pat. Appln. KOKAI Publication No. 61-185879, is promising as a processing method because the method has a high pattern formation accuracy and hence can form fine electrode patterns and small electrode holes. The application of the thin-film manufacturing technology not only improves the definition of electrodes but brings about the following advantages: a dielectric layer and an insulator layer which have been conventionally manufactured by steps of a kind different from the electrode formation step can be manufactured in steps of the same kind; the durability of a recording head can be improved since a layered structure of recording head components conventionally formed between individual electrodes and a dielectric layer or an insulator layer by adhesion or bonding is formed as an integral body of solid state films. Also, the method does not pose the problem brought about by mixing of thin and thick films in the manufacturing method using the thick-film printing technology described above.

Unfortunately, this thin-film manufacturing technology has been conventionally developed as a technology of fabricating primarily semiconductor devices. Therefore, the method is in many instances suited to process materials with defined dimensions such as wafers. That is, the processable size is limited in this method. Accordingly, the method cannot be directly applied as a method of processing elongated materials such as electrostatic recording heads. Also, a very large special manufacturing installation is required to integrally form a thin film, having dimensions meeting the large length, of an electrode layer or a dielectric layer of a recording head. This results in the same problem as in the manufacturing method using the thick-film printing technology. When the length is further increased, the formation of this thin film becomes impossible. Since it also becomes very difficult to form a uniform thin film throughout the large length, the manufacturing yield is extremely lowered.

The manufacturing method disclosed in Jpn. Pat. Appln. KOKAI Publication No. 6-99610 has the problems in improvement of the resolution resulting from the thick-film printing method described above. In this method it is also necessary to form patterns by taking account of dimensional changes brought about by sintering. This further makes it difficult to increase the accuracy of components of a recording head or arrange them at a high density. Additionally, to manufacture a long recording head by using this method, it is necessary to increase the size of partial recording heads constituting the recording head or increase the number of partial recording heads to be arranged. The former method requires a large green sheet from which the recording head is formed, and this makes the dimensional accuracy more and more difficult to maintain. In the latter method, a necessary accuracy of the partial recording heads needs to be increased to keep the accuracy of the overall recording head. This makes the method difficult to practice. Also, electrodes between the partial recording heads must be connected. However, this manufacturing method in which it is assumed that a recording head consists of two partial recording heads cannot connect electrodes between such a large number of partial recording heads. For these reasons, this manufacturing method is inapplicable to a long recording head.

SUMMARY OF THE INVENTION

It is an object of the present invention to solve the above problems of the structures and manufacturing methods of conventional electrostatic recording heads and provide an electrostatic recording head with a large length meeting large-sized recording.

It is another object of the present invention to provide a long electrostatic recording head meeting high-resolution recording by using a thin-film manufacturing technology.

It is still another object of the present invention to provide electrostatic recording heads having various recording widths and capable of being easily manufactured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Embodiments of the present invention will be described below with reference to the accompanying drawings.

Figure 1:
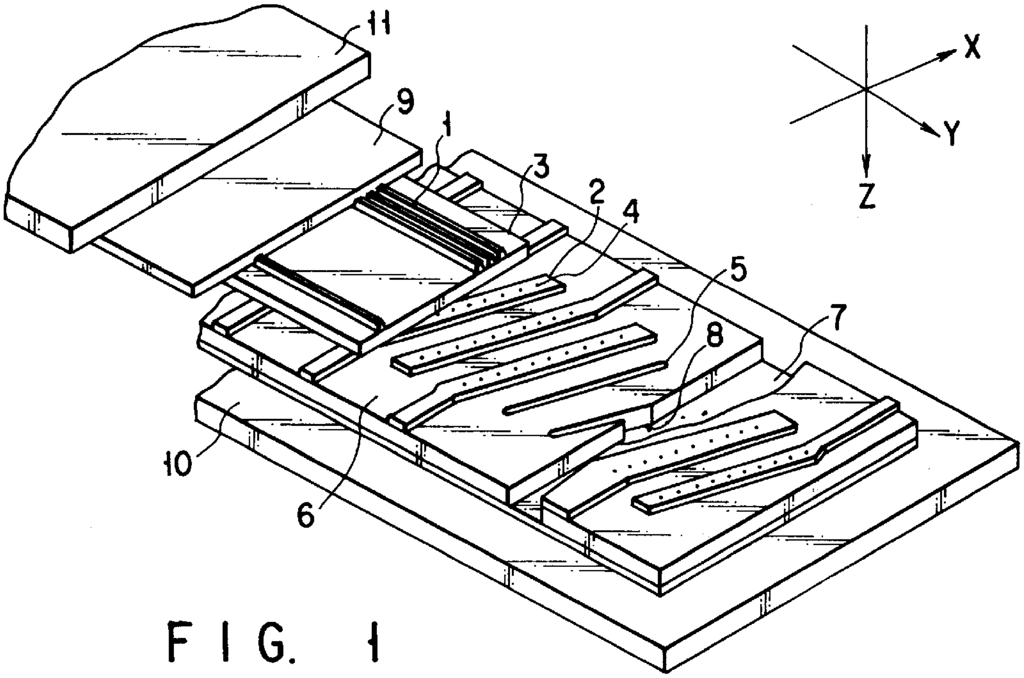
FIG. 1 is a perspective view for explaining the overall structure of an electrostatic recording head to which the present invention is applied.

FIG. 1 is a perspective view for explaining the structure of an electrostatic recording head to which the present invention is applied. For the sake of an easy understanding of the structure, members of the recording head are partially cut away. In FIG. 1, a plurality of line electrodes or induction electrodes 1 are formed on the lower surface of a substrate 9 so as to extend in the longitudinal direction (Y direction) of the recording head at predetermined intervals in the widthwise direction (X direction). One dielectric layer 3 is attached to the lower surfaces of these induction electrodes 1. A plurality of finger electrodes or discharge electrodes 2 are arranged on the lower surface of the dielectric layer 3 so as to extend in the X direction at predetermined intervals in the Y direction. Consequently, the induction electrodes 1 and the discharge electrodes 2 oppose each other on the two sides of the dielectric layer 3, forming a matrix structure. Circular discharge holes 4 for generating charged particles are formed in positions of the discharge electrodes corresponding to matrix intersections (with the induction electrodes 1).

An insulator layer 6 having slits 5 for passing charged particles is formed below the discharge electrodes 2, i.e., along a charged particle radiation direction (Z direction). Each slit 5 extends in the X direction and has dimensions corresponding to all of the discharge holes 4 in the discharge electrode 2. A control electrode 7 made of a single metal layer is arranged on the lower surface of the insulator layer 6. A plurality of control holes 8 for radiating charged particles are formed in the control electrode 7 so as to correspond to the holes in the discharge electrodes.

The individual electrodes, the dielectric layer, and the insulator layer constituting this recording head are stacked and integrally formed on a recording head base 11 and mounted on an image forming apparatus via a mounting frame 10. Each electrode is connected to a recording head driver/controller (not shown) and applied with an AC high-frequency voltage for generating charged particles and a DC control voltage for radiating and controlling charged particles. When the recording head is in operation, flows of charged particles generated from the discharge holes 4 in the discharge electrodes 2 are radiated in the Z direction from the control holes 8 in the control electrode 7. The charged particle flows are so controlled as to reach a recording member placed at a predetermined distance from the recording head.

Figure 2:
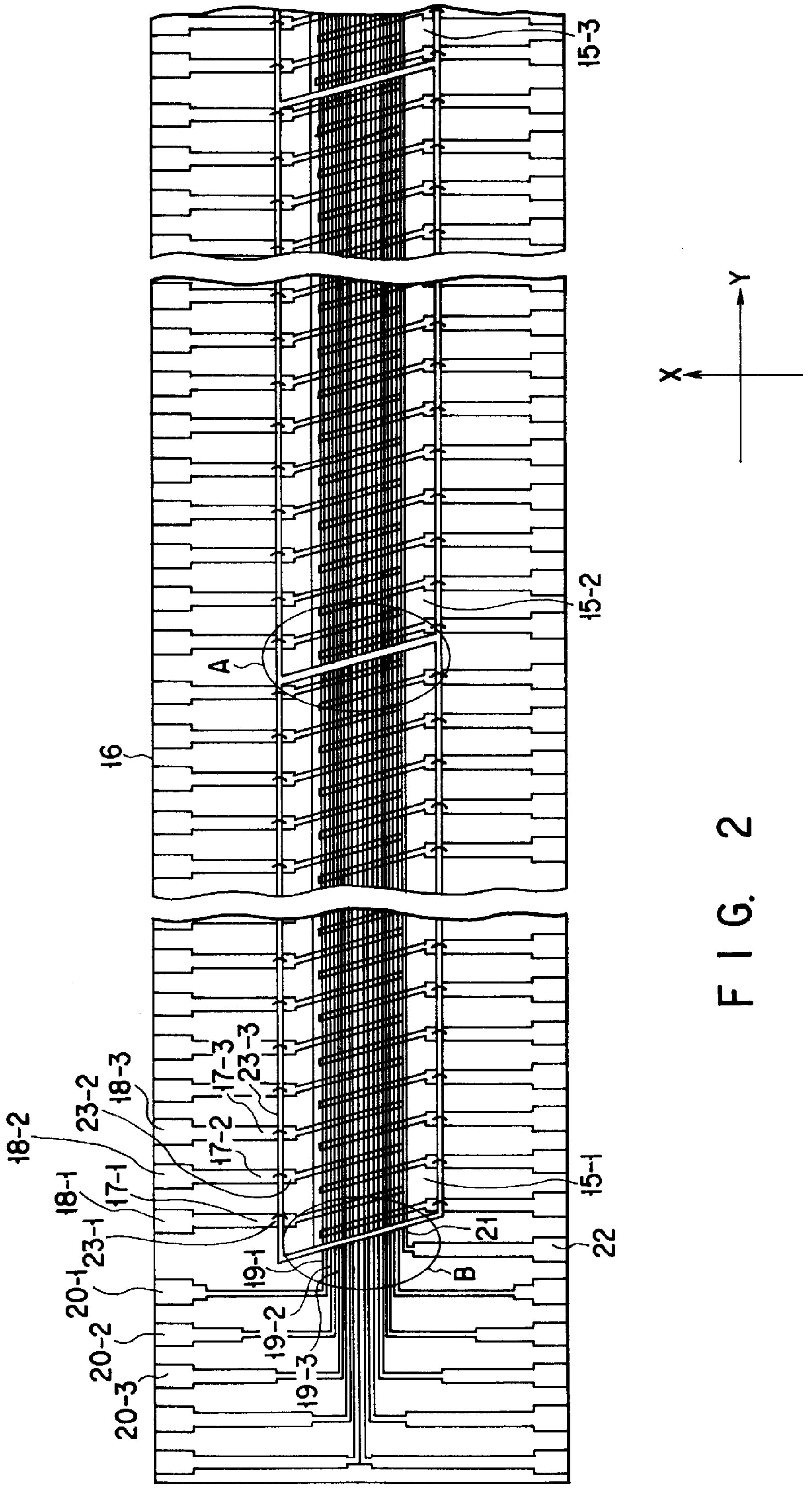
FIG. 2 is a plan view showing an electrostatic recording head according to the first embodiment of the present invention.

FIG. 2 is a view showing the first embodiment of the present invention. FIG. 2 illustrates a substantially half portion of the recording head of this embodiment consisting of four long and narrow head chips. The recording head in FIG. 2 is viewed from the charged particle radiation direction, i.e., the Z direction in FIG. 1. To clearly show that the recording head has an array of a plurality of head chips, the spacings between the head chips are shown in FIG. 2, spaced apart much more than they are the actually spaced. Furthermore, to clearly illustrate the relative positional relationship between the individual electrodes, the dielectric layer, and the insulator layer constituting the head chips, the other components of the recording head are not shown in FIG. 2. (This similarly applies to the drawings of head chips in the subsequent embodiments.)

The recording head of this embodiment has a recording width corresponding to the A4 vertical size (210 mm) and a recording resolution of 300 D.P.I. (Dot Per Inch). The principal parameters of the recording head are as follows.

The numbers of induction and discharge electrodes are 10×160, the array pitch of induction electrodes is 340 $\mu$m (four times the resolution pitch), the size (diameter) of the holes in the discharge electrodes and the control electrode is 150 $\mu$m, and the width of each discharge electrode is 300 $\mu$m.

In FIG. 2, reference numerals 15-1, 15-2, and 15-3 denote head chips constituting the recording head. Head chips of the same kind are used as these head chips. These head chips are arranged on a recording head base (not shown) in the longitudinal direction (Y direction) of the recording head so that the charged particle discharge holes formed in the control electrode on the head chips are arranged at predetermined pitches corresponding to the recording resolution. A circuit board 16 which surrounds the array of head chips and supplies power to the head chips is arranged adjacent to the head chips. Connecting portions 17-1, 17-2, 17-3, . . . , connecting with connecting terminals of the discharge electrodes of the head chips to supply power to these connecting terminals are formed on the inner periphery of the circuit board opposing the head chips. Also, power terminals 18-1, 18-2, 18-3, . . . , for receiving a drive signal from a recording head driver/controller are formed on the outer periphery. The numbers of connecting portions 17-1, 17-2, 17-3, . . . , and power terminals 18-1, 18-2, 18-3, . . . , equal the total number (in this embodiment 40×4=160) of discharge electrodes. Conductor patterns connect these parts. Analogously, connecting portions 19-1, 19-2, 19-3, . . . , for supplying power to the induction electrodes and power terminals 20-1, 20-2, 20-3, . . . , are formed near the end portion of the circuit board. The numbers of connecting portions 19-1, 19-2, 19-3, . . . , and power terminals 20-1, 20-2, 20-3, . . . , equal the number (10 in this embodiment) of induction electrodes. Each pair of these parts are electrically connected by a conductor pattern formed integrally with them. The width of each conductor pattern is increased from substantially the same width as the width of the head chip induction electrode pattern to a width almost three times the initial width as the conductor pattern extends from the connecting portion connecting with the head chip to the power terminal. The positions where the width of these conductor patterns is increased are set such that the lengths of these patterns having substantially the same width as the width of the induction electrodes nearly equal each other. A connecting portion 21 and a power terminal 22 for the control electrode are formed adjacent to the connecting portions to the induction electrodes. As with the head chips, the circuit board is placed on the recording head base.

Thin metal wires 23-1, 23-2, 23-3, . . . , are welded and electrically connected by wire bonding between the connecting terminals of the discharge electrodes on the head chips and the corresponding connecting portions of the circuit board.

Figure 3:
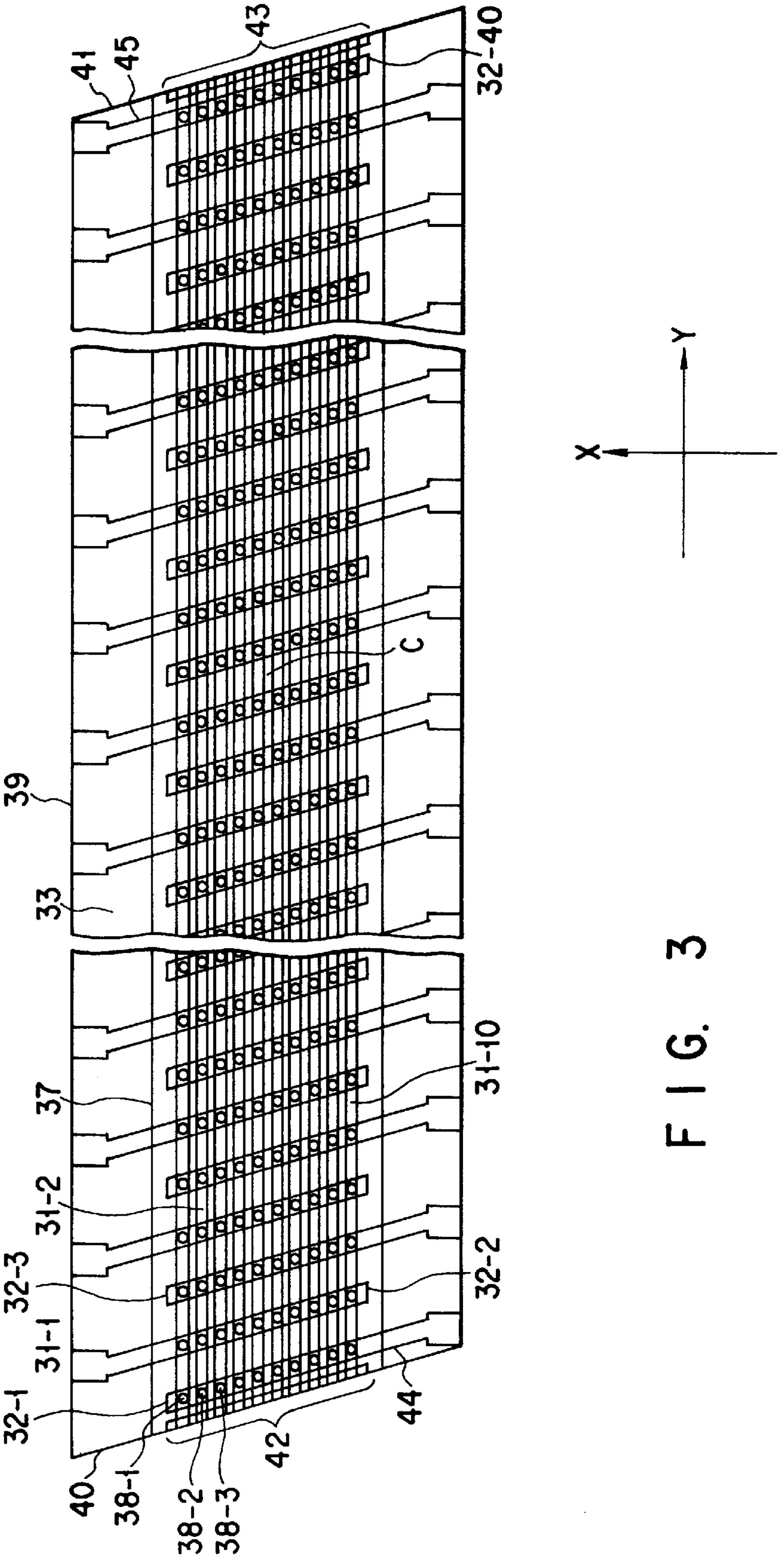
FIG. 3 is a plan view showing a head chip of the electrostatic recording head according to the first embodiment.

FIG. 3 shows details of the head chip of this embodiment. In FIG. 3, reference numerals 31-1, 31-2, . . . , 31-10 denote ten induction electrodes extending on a base 39 of the head chip. These induction electrodes are formed throughout the length of the head chip in the longitudinal direction (Y direction) of the head chip so as to reach end portions 40 and 41 in the longitudinal direction of the head chip. A dielectric layer 33 covering the entire head chip is so stacked as to cover the induction electrodes except for end regions 42 and 43. Forty discharge electrodes 32-1, 32-2, 32-3, . . . , 32-40 are formed on this dielectric layer. These discharge electrodes are so arranged as to form a matrix with the induction electrodes. Charged particle generation holes (not shown because they overlap holes in the control electrode) are formed in all (400) positions corresponding to the matrix intersections of the discharge electrodes. The discharge electrodes are formed by repetitively arranging the same discharge electrode pattern at predetermined intervals in the longitudinal direction of the head chip, i.e., have the same shape. A control electrode 37 is stacked on the discharge electrodes via an insulator layer (not shown because it has the same shape as the control electrode). Charged particle radiation holes 38-1, 38-2, 38-3, . . . , are formed in positions of the control electrode corresponding to the holes in the discharge electrodes. As with the dielectric layer, the insulator layer and the control electrode are not formed in the end regions 42 and 43 of the induction electrodes. Consequently, the induction electrodes are exposed in these end regions.

The end faces 40 and 41 in the longitudinal direction of the head chip of this embodiment are so inclined as to be parallel to the direction (slightly inclined to the X direction) along which the discharge electrodes extend. The positions of outside edges 44 and 45 of the discharge electrodes 32-1 and 32-40 closest to these end faces are so determined as to keep a distance not exceeding ½ of the spacing between the opposing edges of adjacent discharge electrodes. This distance between the head chip end face and the edge of the discharge electrode is set by taking account of a necessary space for position adjustment of adjacent head chips when they are juxtaposed or a connection distance from the induction electrode to the control electrode between the head chips.

The shapes and positions of the individual electrodes, the dielectric layer, and the insulator layer constituting the head chip of this embodiment are so set that these parts are symmetrical about a center C of the head chip. That is, this head chip has a parallelogrammatic shape in which the opposing end faces are parallel.

Figure 4:
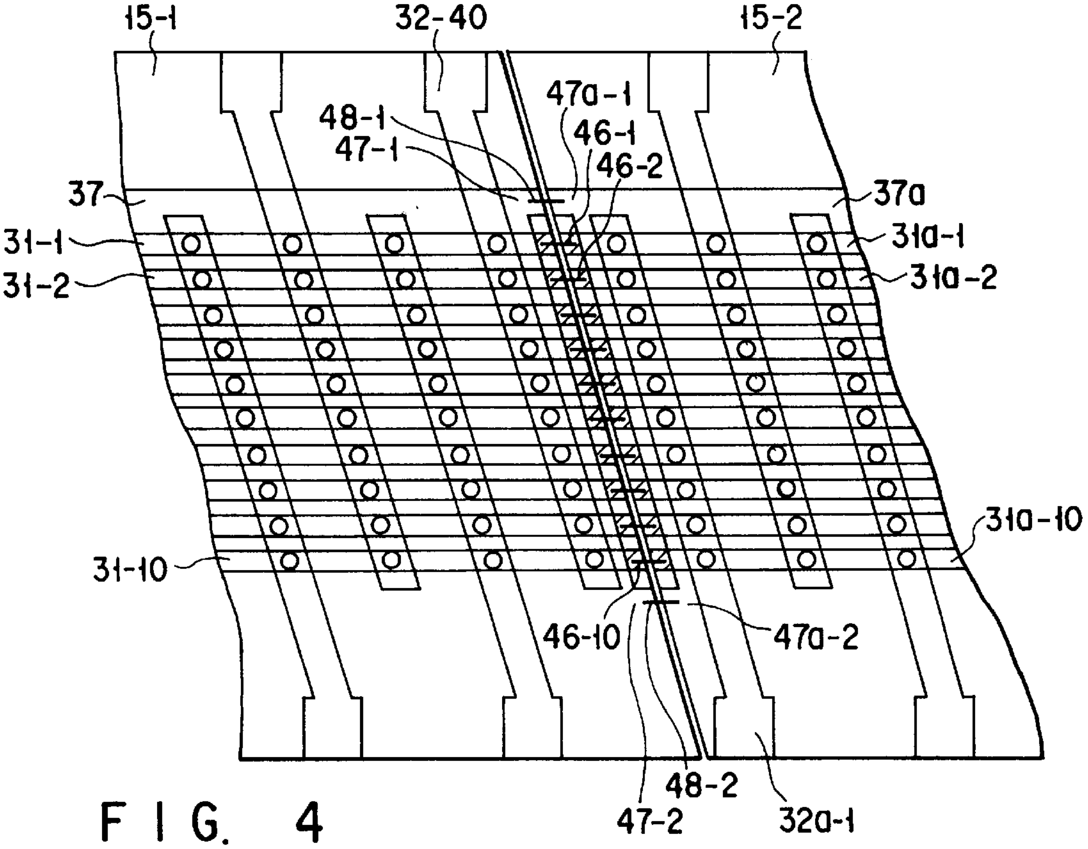
FIG. 4 is a plan view for explaining a method of electrically connecting adjacent head chips of the electrostatic recording head according to the first embodiment, in which a portion A in FIG. 2 is illustrated in an enlarged scale.
Figure 5:
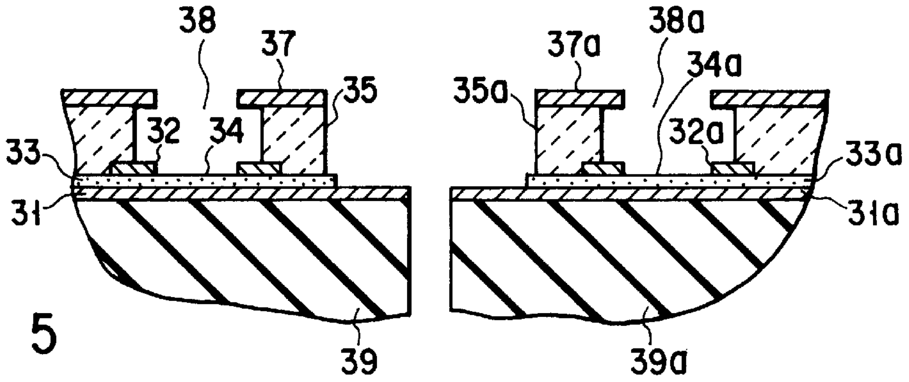
FIG. 5 is a sectional view showing the first step of the connection method in FIG. 4.
Figure 6:
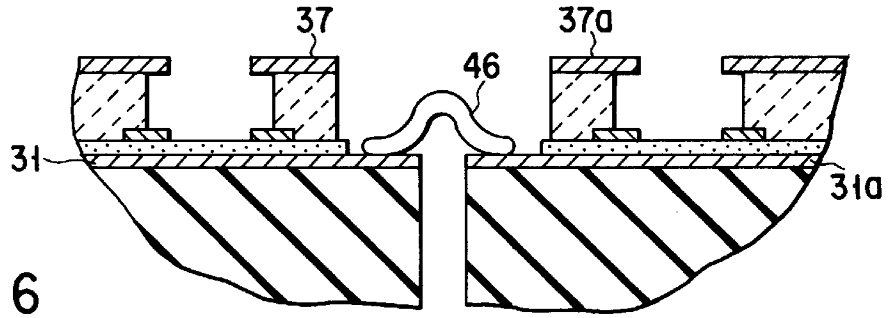
FIG. 6 is a sectional view showing the second step of the connection method in FIG. 4.
Figure 7:
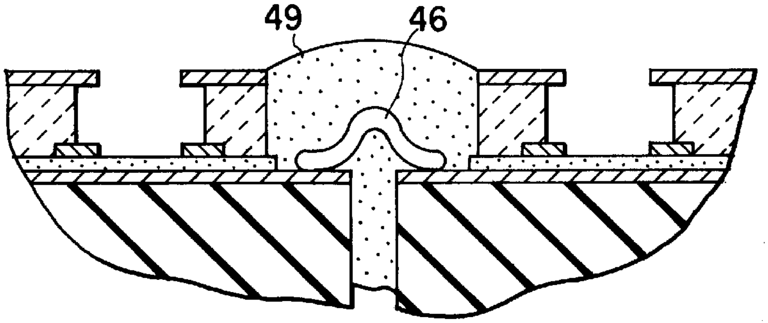
FIG. 7 is a sectional view showing the third step of the connection method in FIG. 4.

A method of interconnecting the induction electrodes and the control electrodes between adjacent head chips will be described below with reference to FIGS. 4 to 8. FIG. 4 shows a portion A in FIG. 2 in an enlarged scale, and FIGS. 5 to 7 illustrate the sections of the interconnecting portions. In these drawings, the same reference numerals as in FIGS. 2 and 3 denote the same parts.

Referring to FIG. 4, the dielectric layer, the insulator layer, and the control electrode illustrated in FIG. 3 are not formed on the head chip end portions (hatched in FIG. 4 for convenience) of the induction electrodes 31-1, 31-2, . . . , 31-10, and so the conductor layer of the induction electrodes is exposed in these portions to form connecting ends. Since a plurality of (four in this embodiment) such head chips are arranged in the recording head of this embodiment, connecting ends are similarly formed in the head chip end portions of induction electrodes 31*a*-1, 31*a*-2, . . . , 31*a*-10 of the adjacent head chip. When the head chips are linearly arranged, these connecting ends oppose each other. The induction electrodes of adjacent head chips are interconnected by electrically connecting these opposing connecting ends. In this embodiment, the induction electrodes are interconnected by welding thin metal wires 46-1, 46-2, . . . , 46-10 to the opposing connecting ends by wire bonding. Analogously, control electrodes 37 and 37*a* formed on adjacent head chips are interconnected by connecting control electrode connecting ends 47-1 and 47-2 to 47*a*-1 and 47*a*-2, respectively, formed in the end portions of the two head chips, by thin metal wires 48-1 and 48-2.

FIGS. 5 to 7 illustrate the sectional structures of the connecting portions of the induction electrodes described above (in FIGS. 5 to 7, parts corresponding to those shown in FIG. 4 are denoted by reference numerals with no suffix numbers for the sake of simplicity). FIG. 5 shows the state in which adjacent head chips are arranged, and FIG. 6 shows the state in which the connecting ends of the corresponding induction electrodes 31 and 31*a* are connected by a thin metal wire 46 by wire bonding. After the connection, the end portions of the control electrodes 37 and 37*a*, the thin metal wire 46, and the end portions of the induction electrodes 31 and 31*a* oppose each other in an exposed state. Accordingly, anomalous discharge may occur between these parts when the recording head is in operation. In this embodiment, therefore, as illustrated in FIG. 7, after the connecting process is completed, an insulating resin 49 encapsulates the connected portions and its vicinity, thereby insulating and covering the electrodes and the thin metal wire. The adjacent control electrodes also are similarly interconnected by a thin metal wire by wire bonding. However, resin encapsulation after the connection is omitted because it is not necessary.

The connection between the head chip in the array end portion and the circuit board illustrated in the portion A of FIG. 2 is done in the same manner as the interconnection between the head chips described above. That is, the connecting terminals of the induction electrodes and the discharge electrodes of the head chip are connected to the corresponding connecting portions of the circuit board by welding thin metal wires by wire bonding. Also, as in the case of the interconnection of the electrodes between the adjacent head chips, the connected portion is encapsulated with an insulating resin after the connection.

Figure 8:
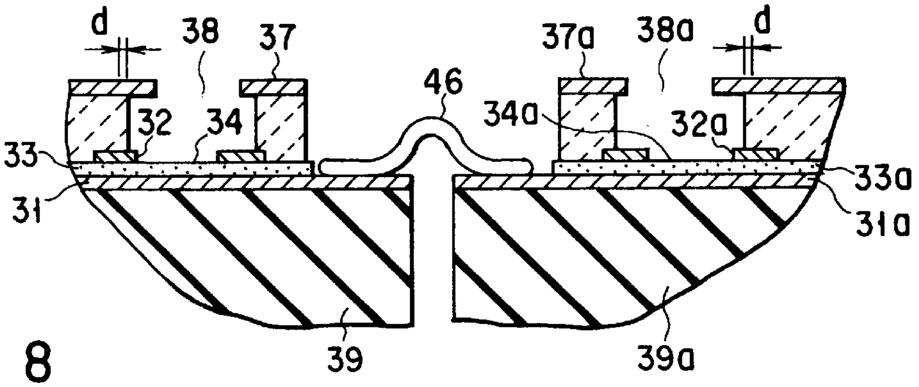
FIG. 8 is a sectional view similar to FIG. 6, which explains a modification of the connection method in FIG. 4.

FIG. 8 shows a modification of the induction electrode connection method in this embodiment. In this method, to ensure the welding length of thin metal wires in wire bonding, the positions of the charged particle generation holes formed in the discharge electrodes located in the end portions of the head chips are shifted toward the centers of the respective head chips. Referring to FIG. 8, of a plurality of discharge electrodes, only two discharge electrodes 32 and 32*a* positioned in the end portions of the head chips are so arranged that their generation holes 34 and 34*a* are shifted by distance d from the regular positions toward the centers of the respective head chips. Note that charged particle radiation holes 38 and 38*a* in the control electrodes 37 and 37*a* are arranged in the regular positions as in the case of FIG. 5.

In this modification, it is possible to increase the length of the exposed portions of the induction electrodes 31 and 31*a* of the head chip end portions and therefore increase the length of the thin metal wire 46 welded to the electrodes. Consequently, the induction electrodes 31 and 31*a* can be electrically interconnected more reliably. Also, the work space for wire bonding can be increased, and this facilitates the work of connection. Enlarging the interconnecting portions of the induction electrodes as described above is particularly effective when the array pitch of discharge electrodes is narrowed and the exposed portions of the induction electrodes are decreased as the resolution of the recording head is increased.

Even when the holes 38 and 38*a* in the discharge electrodes of the head end portions are thus shifted toward the centers of the head chips, the radiation positions of charged particles are almost entirely determined by the positions of the radiation holes in the control electrodes. Therefore, deviations of the radiation positions of charged particles can be decreased within a range that poses no practical problem and does not lower the image quality, if the shift of the holes in the discharge electrodes is very small.

The head chips of this embodiment are manufactured by using a thin-film manufacturing technology and completed by sequentially forming the recording head components on a head chip base. This manufacturing method will be described below with reference to FIGS. 9 to 13.

This method uses a head chip base having the outer shape of a head chip to be manufactured. However, the same manufacturing method is applicable when a wafer is used as the head chip base, the recording head components are formed on the wafer, and the wafer is cut into the outer shape of a desired head chip. FIGS. 9 to 13 illustrate a process of sequentially forming recording head components on the head chip base. That is, FIGS. 9, 10, 11, 12, and 13 show steps of forming induction electrodes, a dielectric layer, discharge electrodes, an insulator layer, and a control electrode, respectively (these parts are hatched in the respective corresponding drawings).

Figure 9:
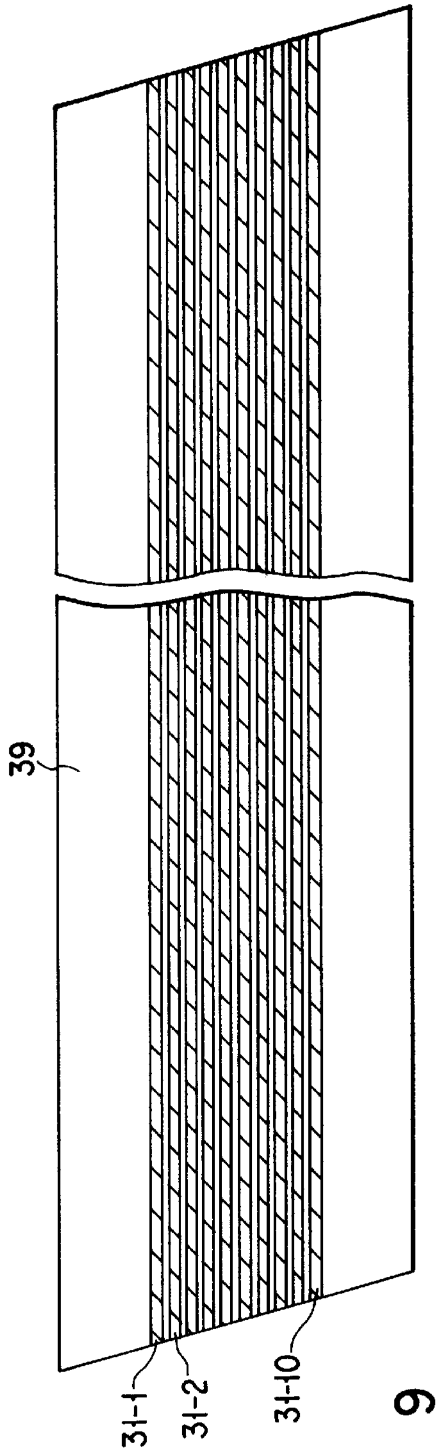
FIG. 9 is a plan view for explaining a method of manufacturing the head chips of the electrostatic recording head according to the first embodiment, in which the first step of the method is illustrated.
Figure 10:
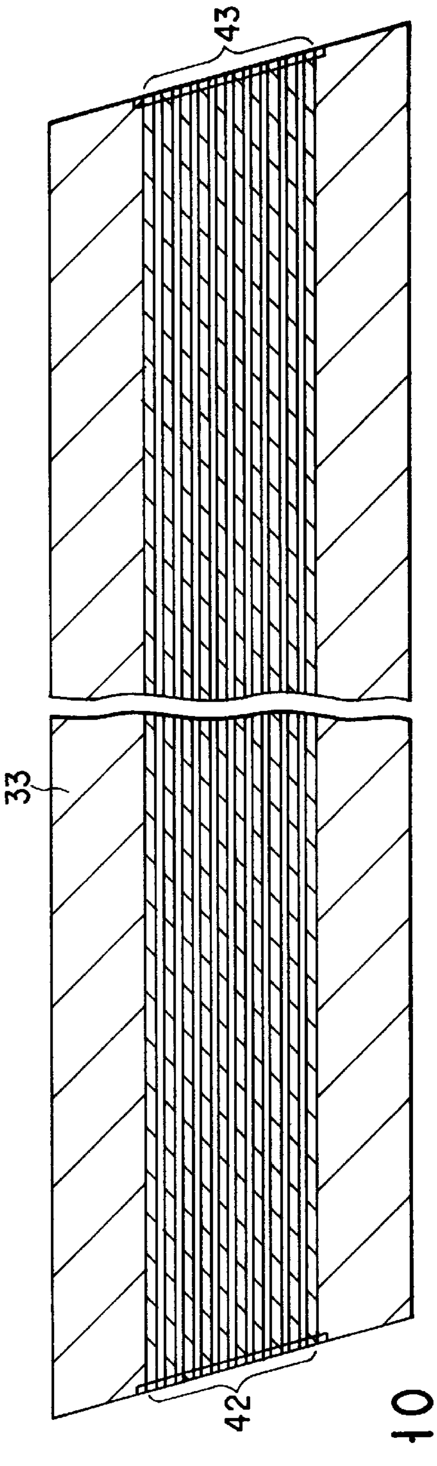
FIG. 10 is a plan view for explaining the second step of the method.
Figure 11:
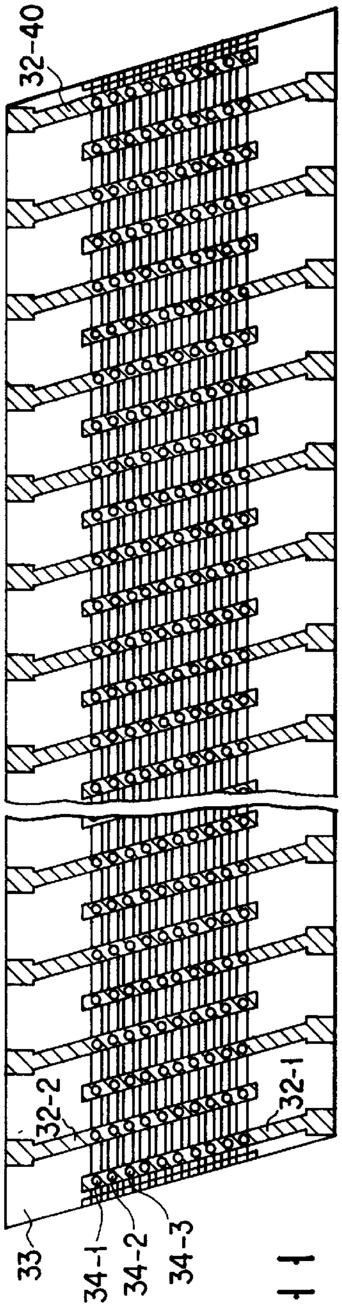
FIG. 11 is a plan view for explaining the third step of the method.
Figure 12:
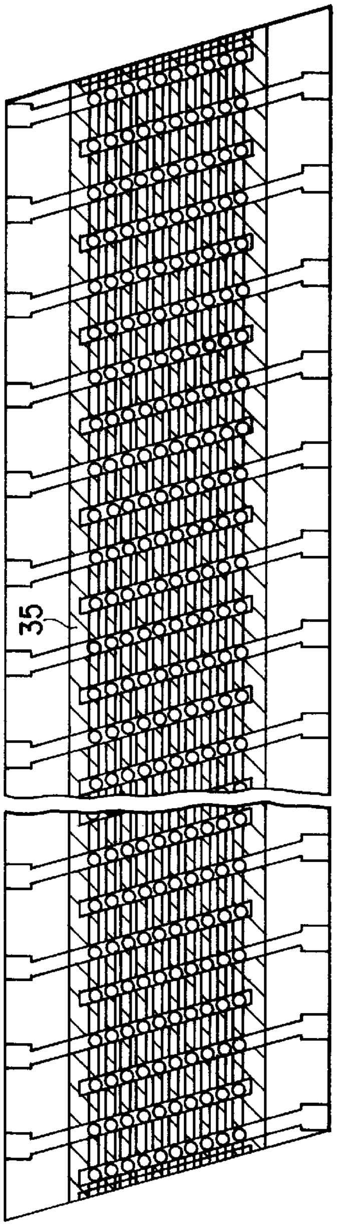
FIG. 12 is a plan view for explaining the fourth step of the method.
Figure 13:
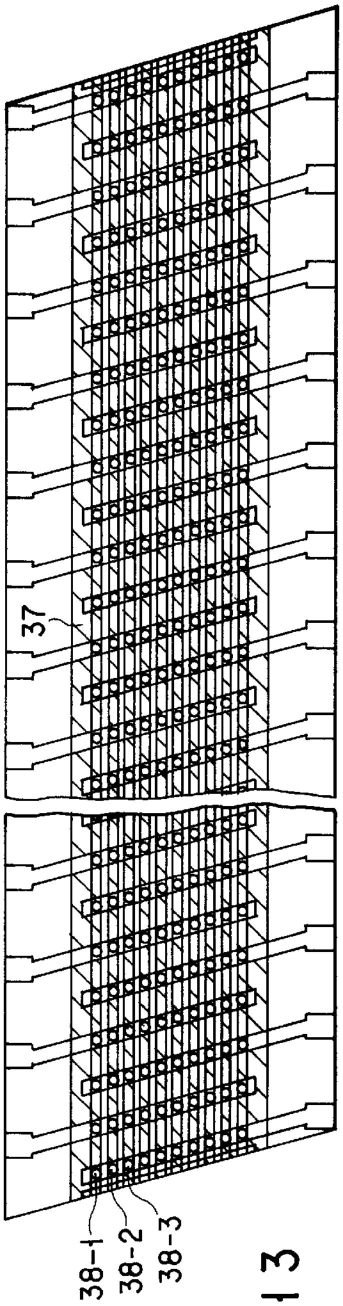
FIG. 13 is a plan view for explaining the fifth step of the method.

The head chip manufacturing method of this embodiment is as follows. First, an aluminum conductor layer (1 $\mu$m thick) is formed by sputtering on a head chip base 39 made of quartz glass (0.5 mm thick), and is etched to form desired induction electrode patterns 31-1, 31-2, . . . , 31-10 (FIG. 9). On top of these induction electrodes and the chip base 39, a silicon oxide dielectric layer 33 (5 $\mu$m thick) is applied by plasma polymerization and partially etched away so as to expose end regions or connecting ends 42 and 43 of the induction electrodes (FIG. 10). A titanium conductor layer (1.5 $\mu$m thick) is formed on the dielectric layer 33 by sputtering, and its unnecessary portions are removed by etching to form discharge electrode patterns 32-1, 32-2, . . . , 32-40 having charged particle generation holes 34-1, 34-2, 34-3, . . . (FIG. 11). Thereafter, the entire region of the upper surface of the head chip is coated with an insulating polyimide layer (150 $\mu$m thick) by spin coating. The polyimide is hardened and etched to form charged particle passing holes and remove the coating from connecting ends and its vicinity of the discharge electrodes and end regions, thereby forming an insulator layer 35 (FIG. 12). These charged particle passing holes are formed in positions corresponding to the holes in the discharge electrodes and each has a size larger than the size of the hole in the discharge electrode and hole in a control electrode. Subsequently, a liquid resist ink is filled in the charged particle passing holes formed in the insulator layer, and is hardened so that the exposed flat surface of the insulating layer and the exposed flat surface of the hardened ink are on the same level. A titanium conductor layer (1.5 $\mu$m thick) is again formed on the resultant structure by sputtering and etched to form a control electrode 37 having an outer shape pattern and charged particle radiation holes 38-1, 38-2, 38-3, . . . (FIG. 13). Finally, a resist removing agent is injected through the radiation holes in the control electrode to remove the hardened resist ink filled in the holes of the insulator layer, thereby completing a head chip.

Figure 14A:
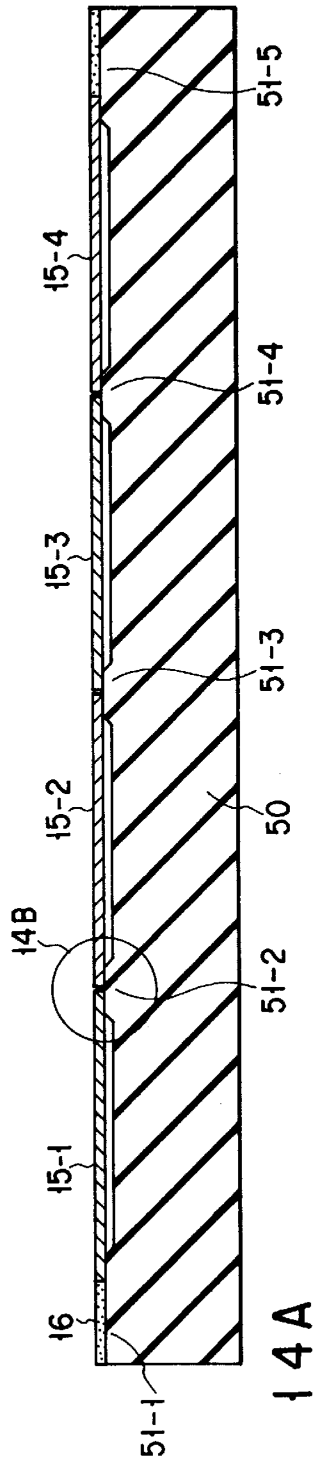
FIG. 14A is a sectional view for explaining the way the head chips are mounted in the first embodiment.
Figure 14B:
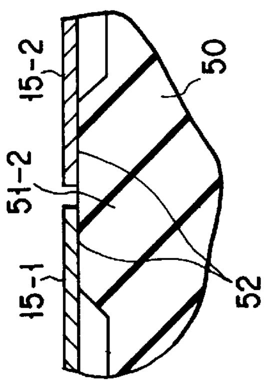
FIG. 14B is an enlarged sectional view of a part of the head chip.

FIGS. 14A and 14B show the way the head chips of this embodiment are mounted. FIG. 14A shows a section when the recording head and the circuit board, as shown in FIG. 2, are cut in the Y direction. In FIG. 14A, reference numeral 50 denotes a recording head base made from an insulating material such as ceramic; 15-1 to 15-4, four head chips mounted on the base 50; and 16, a circuit board. These head chips need only have an insulating support member on the surface in contact with the head base. If this is the case, the recording head base can be made from a metal such as aluminum.

On the head chip mounting surface of the recording head base 50, a plurality of projections 51-1 to 51-5 are formed at positions corresponding to the two ends in the longitudinal direction of the respective head chips 15-1, 15-2, 15-3, and 15-4. In this embodiment, these five projections are formed at predetermined intervals, and the projections 51-2, 51-3, and 51-4 located between the head chips have the same dimensions. The both ends of each head chip are supported on these projections and fixed to the recording head base via an adhesive 52 (FIG. 14B) applied on the surfaces of the projections. Also, the circuit board is so arranged on the recording head base that its surface is substantially even with the surfaces of the head chips. In this embodiment, each projection is elongated in the width direction so as to contact almost the entire region of the head chip in the widthwise direction. However, it is also possible to form a pair of short projecting pieces contacting only corners of each head chip. Alternatively, a plurality of discontinuous projecting pieces can be arranged along the edge of each head chip.

This embodiment with the above arrangement has the following characteristic features compared to the structures and manufacturing methods of conventional electrostatic recording heads.

Since the recording head is manufactured by arranging a plurality of head chips, the components of the recording head need only be manufactured with dimensions meeting the size of each head chip. This obviates the need for a large manufacturing installation in the manufacture of the recording head. Especially in manufacturing a recording head having a thin-film structure, this eliminates the limitations on the size of the recording head imposed by the maximum processing size of the manufacturing installation. Also, since it is unnecessary to introduce a large manufacturing installation to manufacture the recording head, a recording head with a thin-film structure which is conventionally difficult to realize can be manufactured. Additionally, since the recording head is constructed by a plurality of head chips, recording heads meeting various recording widths including long ones can be manufactured by changing the arrangement of head chips or the number of head chips to be arranged. This eliminates a large change in a manufacturing installation or an assembly apparatus caused by switching between recording head sizes such as in conventional methods.

In this embodiment, head chips are manufactured by using a thin-film manufacturing technology. Accordingly, it is possible to improve the pattern accuracy of each electrode, densify and uniformize the dielectric layer and the insulator laser, and attain a solid-state stacked structure between each electrode and the dielectric layer and the insulator layer. The result is that the resolution of the recording head may be increased and the uniformity and the durability of the head may be improved.

In the head chip arrangement of this embodiment, the recording head is split into head chips at the central position between adjacent discharge electrodes, and the direction of the split line as the end portion edge of the head chip coincides with the extending direction of the discharge electrodes. Accordingly, it is unnecessary to split the discharge electrodes between adjacent head chips even in the head chip arrangement. Also, the distance between the end portion edge of the head chip and the edge of the discharge electrode is kept constant, and this ensures a region to which a thin metal wire is connected to perform an induction electrode interconnecting process. The split positions are set as described above such that the two end portion edges of the head chip are formed along the split line, and the individual electrodes in the head chip are so formed by repeating the same pattern that the array of electrodes is symmetrical about the center of the head chip. Consequently, head chips of the same kind can be used. Additionally, the routes for supplying power to the head chip array are formed such that the electrode end portions of the head chip in the end portion of the array are connected to the connecting terminals of the circuit board by wire bonding as in the connection between the head chips. Consequently, identical head chips can be used in the end portions and the intermediate portion of the array. Accordingly, the overall recording head can be formed by using head chips of the same kind, and this eliminates the directionality of the head chips. This simplifies the operations of manufacturing and arranging the head chips.

Furthermore, the discharge electrodes and the control electrodes split by the head chip arrangement are electrically interconnected by connecting the opposing portions of these electrodes between adjacent chips by thin metal wires by using wire bonding. Consequently, the individual electrodes can be interconnected by a uniform length at the shortest distance without being extended. This prevents an increase and a variation in the load resistances of the induction electrodes and also prevents crosstalk. Since no special space is required to interconnect the electrodes, the size of the head chip can be minimized. This increases the number of head chips that can be cut from a single wafer in the thin-film manufacturing step and improves the efficiency of manufacture. Furthermore, in this embodiment the interconnected portion of the discharge electrodes is encapsulated with an insulating resin. Accordingly, when the recording head is in operation it is possible to prevent abnormal discharge between the induction electrodes and the control electrodes in the electrode interconnected portion.

The embodiment has the following advantage in respect of the uniformity of load impedances of the induction electrodes. Since the edges of the two ends of the head chip are formed along the extending direction of the discharge electrodes, the induction electrodes in the head chip have a uniform length. Also, the induction electrodes of the head chips in the end portions of the array are connected to the circuit board at the shortest distance and the induction electrodes of adjacent head chips are also interconnected at the shortest distance in the respective opposing portions. In these connected or interconnected portions, therefore, there is no difference in the length and the interconnected state between the induction electrodes. Furthermore, on the circuit board for supplying power to the head chips, the lengths of the conductor patterns having the same width as the induction electrode width are substantially equal between the induction electrodes. Consequently, a variation in the load impedances of the induction electrodes hardly occurs on the circuit board.

This embodiment achieves the following effects since the head chips are fixed to the recording head base only at the projections on the recording head base as described previously. First, the mounting span of the head chip can be maximized, and so a decrease in the mounting accuracy can be prevented even when the head chip is short. Also, it is possible to reduce the possibility that foreign matter such as dust particles penetrate into the adhesive layer between the recording head base and the head chip and lower the mounting accuracy of the head chip. This facilitates the head chip mounting work.

This embodiment has the arrangement as described in the paragraph of explanation of the parameters but is not limited to this arrangement. That is, the numbers of induction and discharge electrodes, the size of the head chip determined by the number into which the recording head is split, the number of discharge electrodes arranged in the head chip, and the like parameter can be optimally combined by taking account of, e.g., the recording width and the necessary resolution of a recording head to be manufactured and the manufacturing installation of head chips.

In this embodiment, the recording head is manufactured by the thin-film formation method, the materials, and the thickness described above. However, various thin-film manufacturing technologies and materials also can be used. It is also possible to meet various recording densities and recording rates by changing the arrangement or the size of holes formed in the electrodes.

Clean materials which meet the thin-film manufacturing step and do not release gases are suitable as the recording head base. As the material of the induction electrodes, metal materials meeting the thin-film manufacturing step are usable. To decrease the load during driving, low-resistance materials such as Al, Cu, Ag, and Au and their alloys are desirable. Materials having discharge resistance and corrosion resistance are preferable as the discharge electrode material. It is possible to use high-melting-point materials such as Ti, Mo, W, Cr, V, Pt, and Ni and their alloys. Ti, Mo, and W are practical materials since they facilitate the thin-film manufacturing step.

As the dielectric layer forming technology, it is possible to apply not only the plasma polymerization used in the embodiment but various thin-film manufacturing technologies such as CVD, glow discharge polymerization, electron beam vapor deposition, and a sol-gel method. As the material of the dielectric, materials formable by these thin-film manufacturing technologies can also be used in addition to silicon oxide. Examples are silicon nitride ($Si_3N_4$), magnesium oxide (MgO), aluminum oxide ($Al_2O_3$), and titanium oxide ($TiO_2$).

A practical range of the thicknesses of the induction electrodes, the discharge electrodes, and the control electrode is 0.3 to 10 $\mu$m when the film formation rates of various thin-film manufacturing technologies are taken into account. However, to reduce electrical resistance and minimize surface unevenness, the thickness of the induction electrodes is preferably 0.5 to 3 μm. Although the thickness of the discharge electrodes is preferably 1 μm or larger from the viewpoint of discharge resistance, the upper-limit value of the thickness is desirably 5 μm to suppress a rise in the discharge start voltage. It is desirable that the thickness of the dielectric layer be 4 μm or smaller to reduce the discharge start voltage, and that the lower-limit value of the thickness of the dielectric layer be 1 μm when the resistance against the applied voltage for discharge is taken into consideration.

The second embodiment of the present invention will be described below with reference to FIG. 15.

In this embodiment, an electrostatic recording head having parameters similar to those in the first embodiment is manufactured by arranging four head chips. To easily understand that the recording head constructed by an array of head chips, the spacings between the head chips shown in FIG. 15 are wider than the actual ones.

Figure 15:
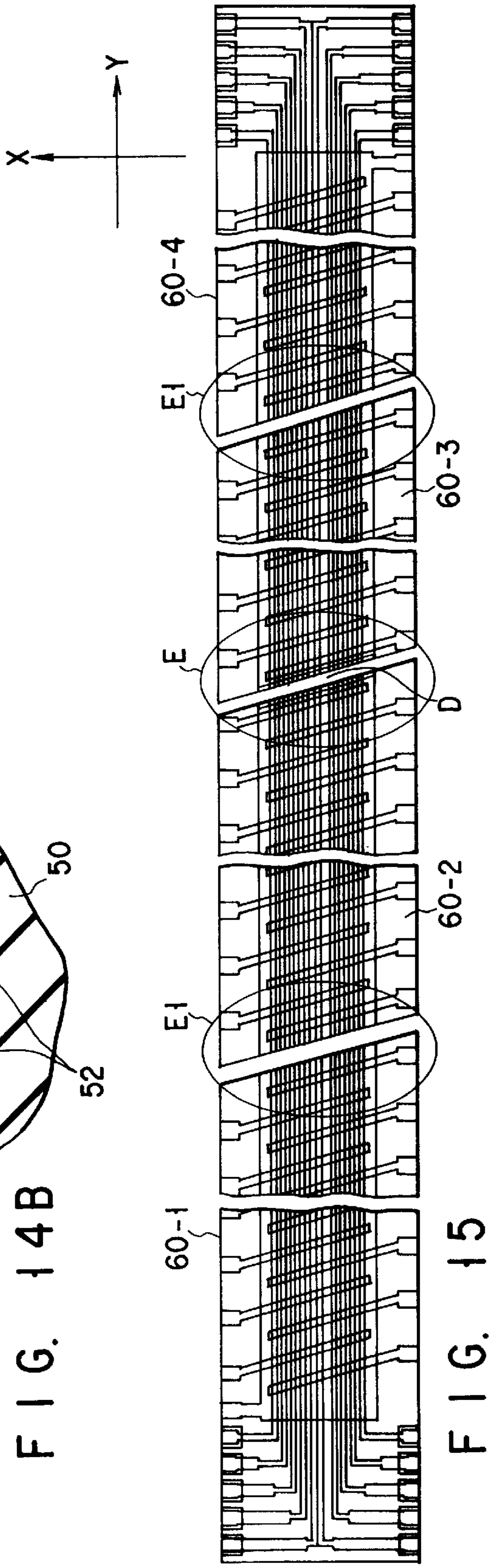
FIG. 15 is a plan view showing an electrostatic recording head according to the second embodiment of the present invention.
Figure 16:
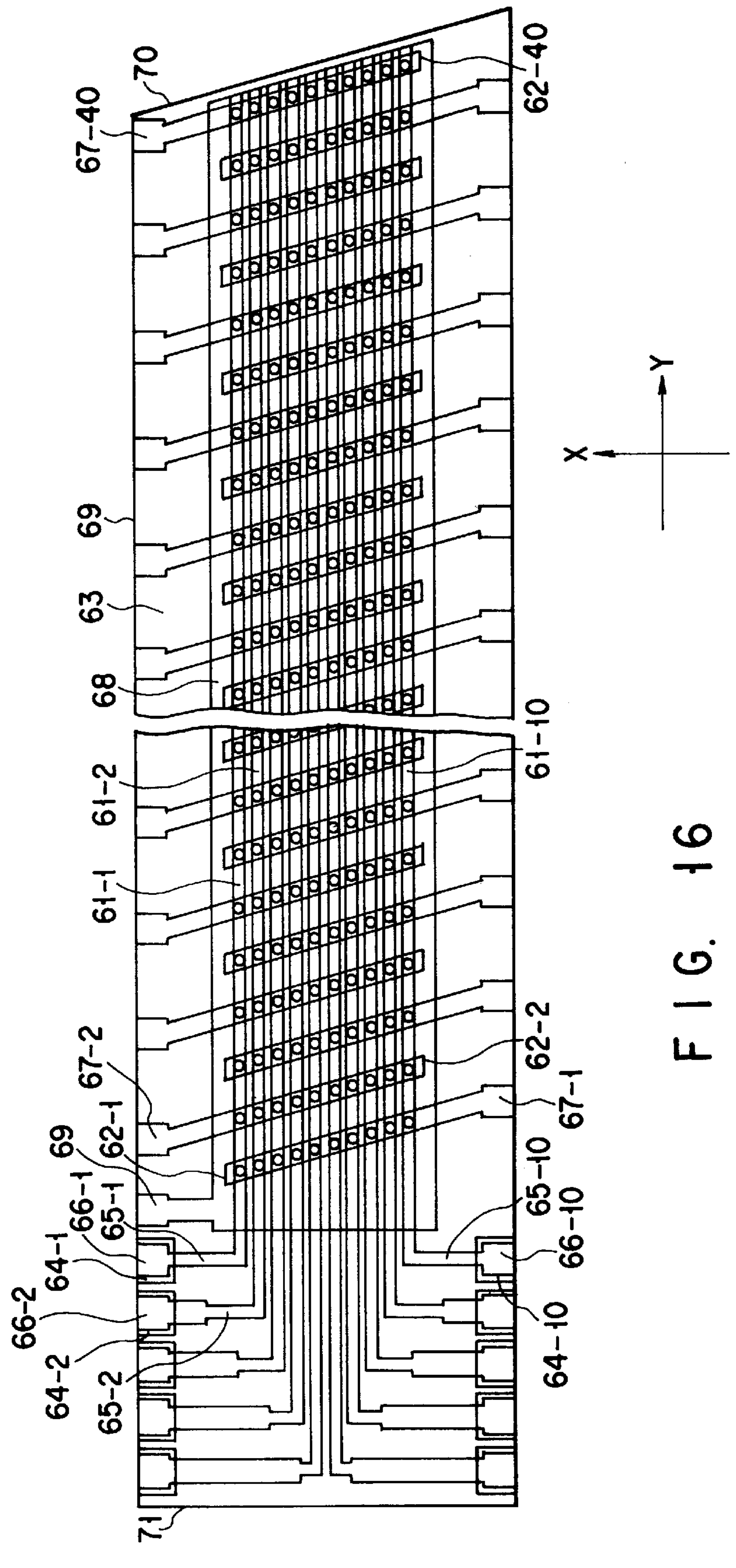
FIG. 16 is a plan view showing a head chip of the electrostatic recording head according to the second embodiment.

In FIG. 15, reference numerals 60-1, 60-2, 60-3, and 60-4 denote head chips of the same kind constituting this recording head. Of these four head chips, two head chips (end head chips) 60-1 and 60-4 on the two sides have the same shape, and two head chips (middle head chips) 60-2 and 60-3 in the middle have the same shape. The end head chips are inverted 180° from each other about the center (point D in FIG. 15) of the recording head and oppose each other on the two sides of the middle head chips. Each end head chip is placed on a recording head base (not shown) such that holes in a control electrode are arranged at predetermined array pitches along the longitudinal direction (Y direction) of the recording head. Lines splitting the recording head into four head chips indicate positions at which the recording head is split into four parts. As in the head chip end portion in the first embodiment, each split line extends along the extending direction of discharge electrodes through a middle portion between the edges of adjacent discharge electrodes. Of opposing portions E and $E_1$ of the head chips shown in FIG. 15, in the opposing portion E between the middle head chips only the end portions of the two head chips are arranged near each other and an electrical connecting process for interconnecting induction electrodes or control electrodes such as done in the first embodiment is not performed. In each opposing portion $E_1$ between the end head chip and the middle head chip, the induction electrodes and the control electrodes are respectively interconnected via lead wires in the same fashion as in the first embodiment. That is, this recording head is electrically split into two chip head assemblies (each assembly consists of one end head chip and one middle head chip). In the side portions along the longitudinal direction of each head chip assembly, connecting terminals of 10 induction electrodes, 80 discharge electrodes, and one control electrode are arranged in numbers corresponding to the numbers of individual electrodes. Power supply to the induction electrodes and the control electrode in one head chip assembly is performed independently of that in the other head chip assembly. FIG. 16 shows the structure of the end head chip of this embodiment. In FIG. 16, reference numerals 61-1, 61-2, . . . , 61-10 denote ten induction electrodes extending on a head chip base 69. These induction electrodes extend from the vicinity of an end portion 70 of the head chip corresponding to the split side toward the vicinity of an end portion 71 different from the head chip split side.

Forty discharge electrodes 62-1, 62-2, . . . , 62-40 are arranged by repeating the same pattern on the induction electrodes via a dielectric layer 63, these discharge electrodes and the induction electrodes together form a matrix.

Connecting terminals 67-1, 67-2, . . . , 67-40 for supplying power to the discharge electrodes are formed in the end portions in the extending direction of the electrodes. These connecting terminals are arranged at predetermined pitches almost all over the side portions along the longitudinal direction of the head chip. Connecting terminals 66-1, 66-2, . . . , 66-10 of the induction electrodes are formed in the end portion of the head chip adjacent to the connecting terminals of the discharge electrodes. These connecting terminals and the induction electrodes are connected by conductor patterns 65-1, 65-2, . . . , 65-10 made of the same conductor layer as the induction electrodes. These conductor patterns connecting the induction electrodes and the connecting terminals are connected to the induction electrodes in portions having a width equivalent to the width of the induction electrode. The width of each conductor pattern is increased to be substantially three times the width of the induction electrode as the conductor pattern extends toward the connecting terminal. The position at which the width is increased differs from one conductor pattern to another so that the lengths of patterns having a width equivalent to the width of the induction electrode are nearly the same. The dielectric layer interposed between the induction electrodes and the discharge electrodes is formed all over the head chip except for regions 64-1, 64-2, . . . , 64-10 surrounding the connecting terminals of the induction electrodes and the end portion 70 of the head chip.

A control electrode 68 is formed on the discharge electrodes via an insulator layer (not shown because it has the same shape as the control electrode). One end portion of the control electrode 68 is connected to a connecting terminal 69 for supplying power. The other end of the control electrode is parallel to the end portion of the split side of the head chip.

The head chips of this embodiment are manufactured by using a thin-film manufacturing technology as in the case of the head chips of the first embodiment.

Figure 17A:
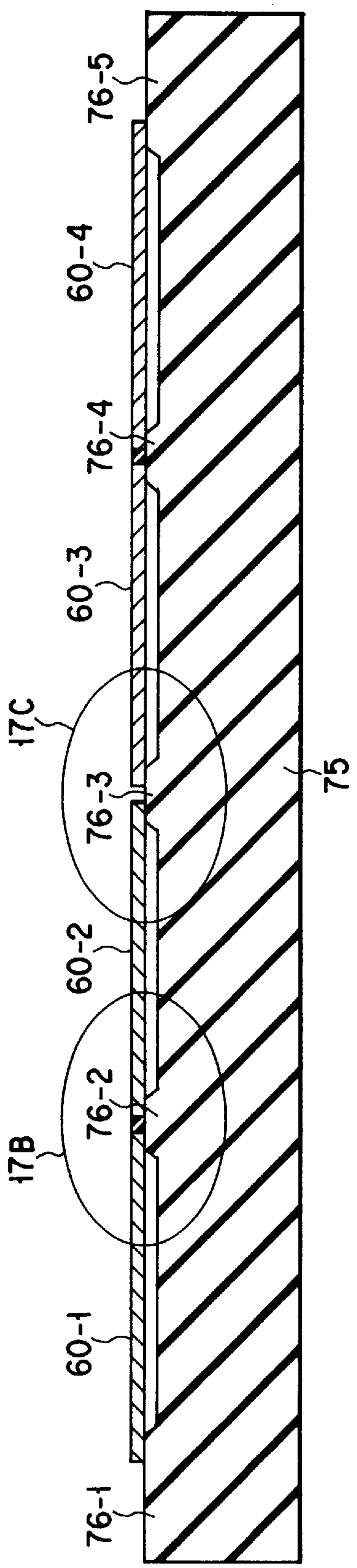
FIG. 17A is a sectional view for explaining the way the head chips of the electrostatic recording head according to the second embodiment are mounted.
Figure 17C:
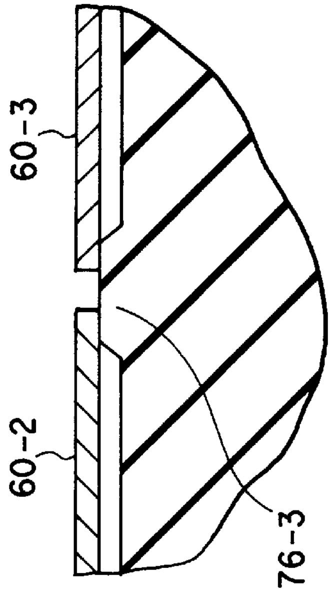
FIGS. 17B and 17C are partial enlarged views of FIG. 17A.
Figure 17B:
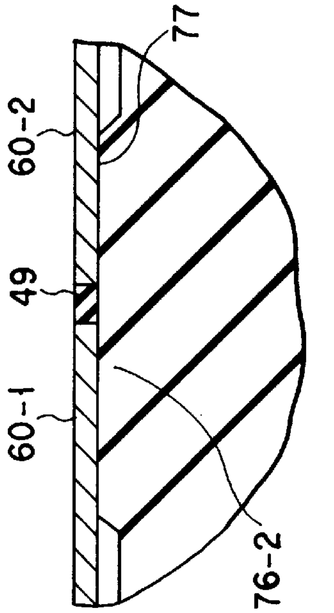

FIGS. 17A to 17C illustrate the way these head chips are mounted. As with FIG. 14A, FIG. 17A shows the section of the recording head cut in the direction of thickness. Referring to FIG. 17A, the four head chips 60-1 to 60-4 constituting the recording head are placed on projections 76-1, 76-2, . . . , 76-5 formed on a recording head base 75. The end portions of these head chips are bonded to the flat upper surfaces of these five projections via an adhesive 77 (FIG. 17B). Alternatively, it is also possible to form projections only in central portions corresponding to the centers of the individual head chips and support the head chips only in their respective central portions by these projections.

As illustrated in FIG. 17B, an insulating member 49 surrounding a lead wire for electrically connecting the corresponding electrodes, such as shown in FIG. 7, is provided between the end head chip 60-1 and the middle head chip 60-2. In FIG. 17C, on the other hand, the middle head chips 60-2 and 60-3 are merely separated from each other and neither a lead wire nor an insulating member is provided between them.

This embodiment with the above structure has the following characteristic features similar to those of the recording head with the structure of the first embodiment, compared to the structures and the manufacturing methods of conventional electrostatic recording heads. That is, since the recording head is constituted by the four head chips split in the longitudinal direction, the processing size when the recording head is manufactured can be decreased. This facilitates the works of manufacturing and assembling the recording head and obviates the need for a large installation in the manufacture of a recording head with a large length. Additionally, since the recording head can be manufactured by head chips of two kinds, the number of types of parts is decreased, and this improves the work efficiency in the manufacture and assembly. Also, the head chips are manufactured by using the thin-film manufacturing technology. Consequently, it is readily possible to improve the performance, e.g., increase the resolution of the recording head and improve the uniformity and the durability of the head. Furthermore, the end head chips and the middle head chips are respectively identical head chips, and in each end head chip the conductor patterns for supplying power to the induction electrodes are uniform between the electrodes. The result is that the individual induction electrodes are driven under the same conditions and this improves the uniformity of charged particle generation performance of the recording head.

This embodiment further has the following characteristic features derived from the head chip arrangement different from that of the first embodiment.

The electrostatic recording head constructed by two head chip assemblies may reduce the number of portions which require positioning and mounting works for the head chip array. Consequently, the recording head assembly work is simplified. Power supply to the electrodes in one head chip assembly is performed independently of that in the other head chip assembly. This makes it unnecessary to electrically interconnect the induction electrodes and the control electrodes split between these head chip assemblies, resulting in greatly simplified manufacturing steps. Also, the connecting terminals for supplying power to the induction electrodes can be formed in the end portion in the longitudinal direction of the head chip assembly. Consequently, the array pitch of connecting terminals can be increased, and this eliminates the need for a special connecting process such as wire bonding done in the first embodiment. Furthermore, power can be directly supplied to the head chip assembly by using a common connecting method such as connector connection without being passed through a circuit board. This increases the degree of freedom of selection for the recording head power supply method.

Moreover, in this embodiment, if the head chip is mounted on and fixed to the recording head base by the projection formed on the recording head base in a position corresponding to a central portion of the head chip, it is possible to prevent or decrease a disturbance in the mounting position of the head chip caused by foreign matter such as dust particles penetrating into the adhesive layer between the recording head base and the head chip.

The third embodiment of the present invention will be described below with reference to FIG. 18.

This embodiment is an electrostatic recording head constructed by four head chips and having parameters analogous to those in the first embodiment. A method of connecting induction electrodes between the head chips and a connection method for supplying power to a chip in the end portion of an array are different from those of the first embodiment. FIG. 18 shows the arrangement of a substantially half region of the recording head. A circuit board for power supply arranged around the head chips is omitted from FIG. 18, since the board has an arrangement similar to that in the first embodiment.

Figure 18:
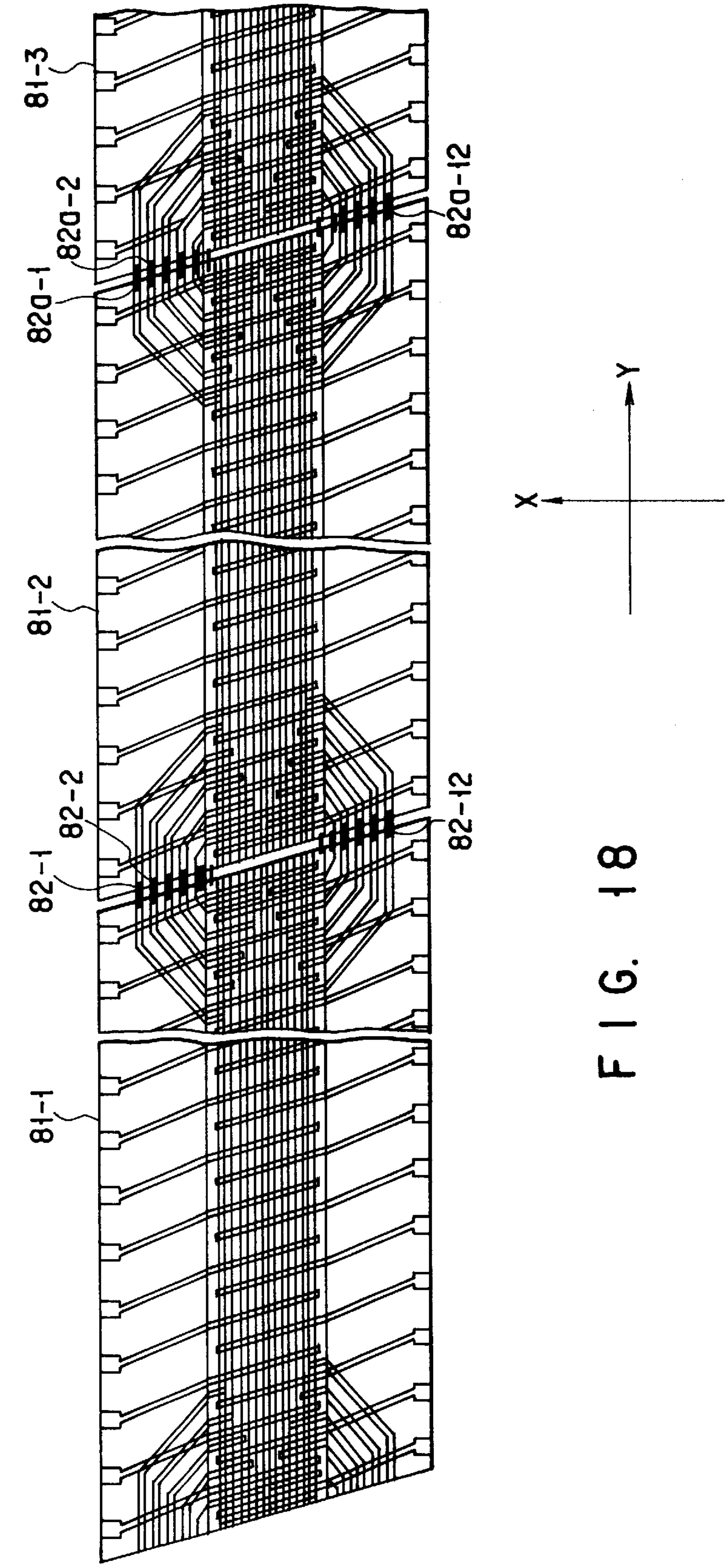
FIG. 18 is a plan view showing an electrostatic recording head according to the third embodiment of the present invention.

In FIG. 18, reference numerals 81-1, 81-2, and 81-3 denote head chips constituting the recording head. These head chips are arranged in a line along the longitudinal direction so that a predetermined array accuracy is held. These head chips are of the same kind and so arranged in a line that the interconnecting portions of induction electrodes and control electrodes (to be described later) oppose each other on the two sides of each split position. The induction electrodes and the control electrodes of the split head chips are respectively interconnected by forming and hardening island patterns 82-1, 82-2, . . . , 82-12 and 82*a*-1, 82*a*-2, . . . , 82*a*-12 made from a conductive paste across these opposing interconnecting portions. In the head chips in the end portions of the head chip array, the induction electrodes and the control electrodes are connected to a circuit board, or the discharge electrodes are connected to the circuit board, in the same manner as above. That is, conductive paste island patterns are formed between the connecting portions of the induction electrodes and the control electrodes and the corresponding connecting terminals (not shown) of the circuit board, or between the connecting portions of the discharge electrodes and the connecting terminals of the circuit board.

Figure 19:
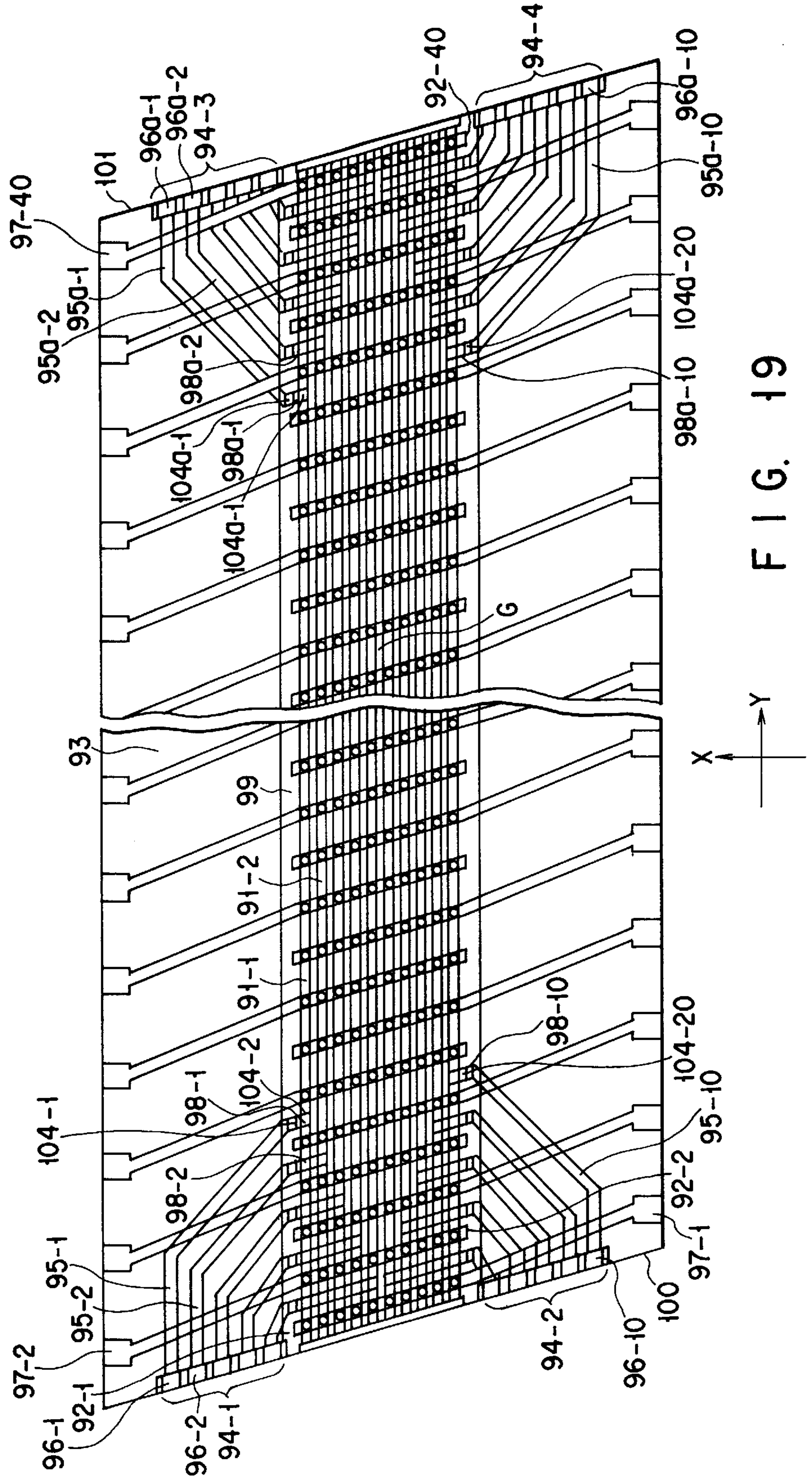
FIG. 19 is a plan view showing a head chip of the electrostatic recording head according to the third embodiment.

FIG. 19 shows details of the head chip of this embodiment. In FIG. 19, reference numerals 91-1, 91-2, . . . , 91-10 denote ten parallel induction electrodes extending from one end to the other on a head chip base 99. These induction electrodes are formed to extend between positions slightly shifted from two end faces 100 and 101 of the head chip toward the center of the chip. That is, the two ends of each induction electrode are slightly separated from the end faces 100 and 101 of the head chip.

Forty discharge electrodes are formed by repeating the same pattern in the longitudinal direction on the induction electrodes via a dielectric layer 93. These discharge electrodes and the induction electrodes together form a matrix. The end portions in the extending direction of the individual discharge electrodes are connected to connecting terminals 97-1, 97-2, . . . , 97-40 for supplying power to the electrodes. These connecting terminals are arranged at predetermined pitches all over the side portions along the longitudinal direction of the head chip. In a region outside the induction electrodes in one end portion in the longitudinal direction of the head chip, interconnecting portions 96-1, 96-2, . . . , 96-10 for interconnecting the induction electrodes of adjacent head chips and connecting patterns or lines 95-1, 95-2, . . . , 95-10 extending from these interconnecting portions to the induction electrodes are formed. In a similar way, interconnecting portions 96*a*-1, 96*a*-2, . . . , 96*a*-10 and connecting patterns 95*a*-1, 95*a*-1, . . . , 95*a*-10 are formed in the other end of the head chip. These interconnecting portions and connecting patterns are made of the same conductor layer as the induction electrodes and formed simultaneously with the induction electrodes.

In a region in one end portion of the surface of the head chip on which the discharge electrodes are arranged, extracting patterns or lines 98-1, 98-2, . . . , 98-10 for connecting the individual induction electrodes to the corresponding connecting patterns are formed. Each extracting pattern is formed parallel to the extending direction of the discharge electrodes in the vicinity of a middle portion between adjacent discharge electrodes so as to cross the induction electrodes. The extracting patterns connect positions on the induction electrodes to be extracted and intersections with the connecting patterns outside the region in which the induction electrodes are arranged. Similar extracting patterns 98*a*-1, 98*a*-2, . . . , 98*a*-10 are formed in the other end of the head chip. These extracting patterns are formed simultaneously with the discharge electrodes from the same conductor layer as the discharge electrodes.

Electrical connections between the connecting patterns and the extracting patterns and between the extracting patterns and the induction electrodes are performed by forming small windows or through holes 104-1, 104-2, . . . , 104-20 and 104*a*-1, 104*a*-2, . . . , 104*a*-20 for the connections in the dielectric layer and inserting the end portions of the extracting patterns through these holes. Each small window has a rectangular shape whose sides extending along the extending direction of the induction electrode are long sides. Details of this connection method will be described below with reference to FIGS. 20A to 20D. In this method, a conductor layer of induction electrodes and a conductor layer of discharge electrodes opposing each other via a dielectric layer are electrically connected by forming small windows for the connection in necessary portions of the dielectric layer.

Figure 20A:
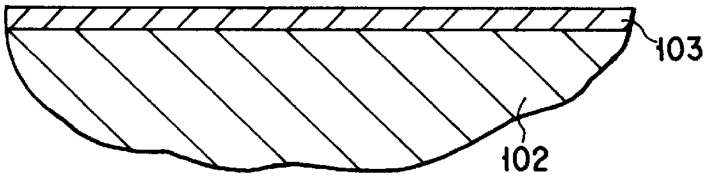
FIGS. 20A to 20D are views for explaining an electrical connection between a connecting pattern and an extracting pattern and an electrical connection between the extracting pattern and an induction electrode.
Figure 20B:
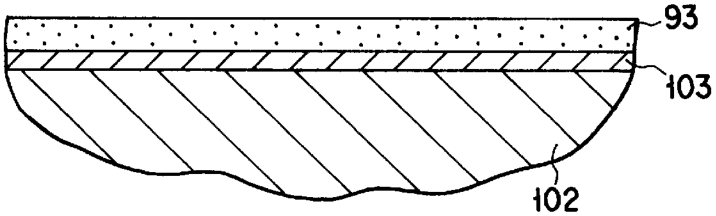
Figure 20C:
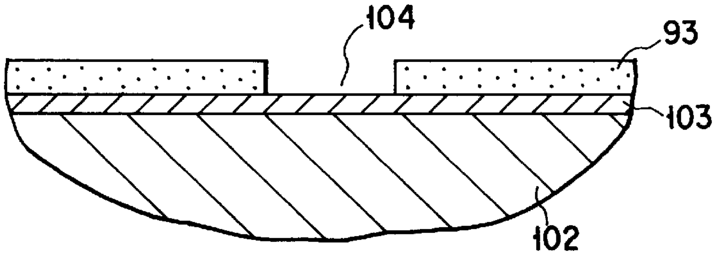
Figure 20D:
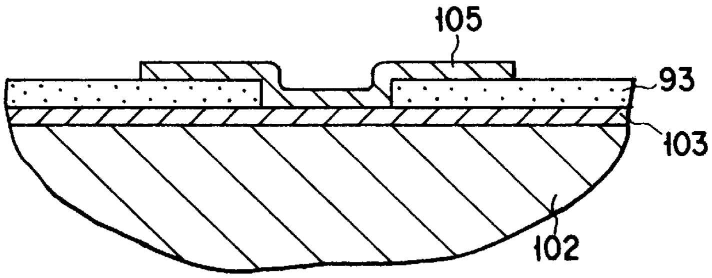

A conductor layer 103 of induction electrodes is formed on a head chip base 102 and patterned to form induction electrodes and connecting patterns (FIG. 20A). A dielectric layer 93 is stacked on this conductor layer 103 (FIG. 20B), and portions of the dielectric layer at which the above electrical connection are performed are removed to form small windows 104 for the connection which partially expose the conductor layer 103 (FIG. 20C). Thereafter, a discharge electrode conductor layer 105 is evenly stacked on the dielectric layer 93 including the exposed portion of the conductor layer 103 so that the conductor layer 105 is continuously formed from the dielectric wall surfaces in each small window to the surface of the induction electrode conductor layer. The conductor layer 105 is then patterned to form a discharge electrode pattern (discharge electrodes) and an extracting pattern (FIG. 20D). In this arrangement the long sides of the small windows are formed along the extending direction of the induction electrodes. Therefore, even when the width of the induction electrode is small, the length of the entire perimeter of the small window can be increased, and this realizes a reliable electrical connection.

The dielectric layer 93 interposed between the induction electrodes and the discharge electrodes is formed all over the head chip except for regions 94-1 to 94-4 in interconnecting portions of the induction electrodes and the small windows. In the interconnecting portions of the induction electrodes and the bottoms of the small windows, no dielectric layer is formed and the conductor layer is partially exposed.

A control electrode 99 (FIG. 19) having charged particle radiation holes is formed on the discharge electrodes via an insulator layer (not shown).

As in the first embodiment, the end surface of the portions 100 and 101 in the longitudinal direction of the head chip of this embodiment have inclinations parallel to the extending direction of the discharge electrodes in a region in which charged particle generation holes are arranged. The position of this inclination is so determined that the distance between the inclination and the edge of the discharge electrode in the end portion does not exceed ½ the edge interval between adjacent discharge electrodes. Also, the shapes and arrangements of the individual electrodes, the dielectric layer, and the insulator layer constituting the head chip of this embodiment are set such that these parts are symmetrical about a center G of the head chip.

The head chips of this embodiment are manufactured by using a thin-film manufacturing technology as in the first and second embodiments. This method will be described below with reference to FIGS. 21 to 25.

Although a manufacturing method using a base having the outer shape of a completed head chip will be described below, the same method is applicable when recording head components are formed on a wafer and the wafer is cut into the outer shape of a head chip. FIGS. 21, 22, 23, 24, and 25 illustrate steps of forming an induction electrode layer, a dielectric layer, a discharge electrode layer, an insulator layer, and a control electrode layer, respectively (these layers are hatched in the respective corresponding drawings).

Figure 21:
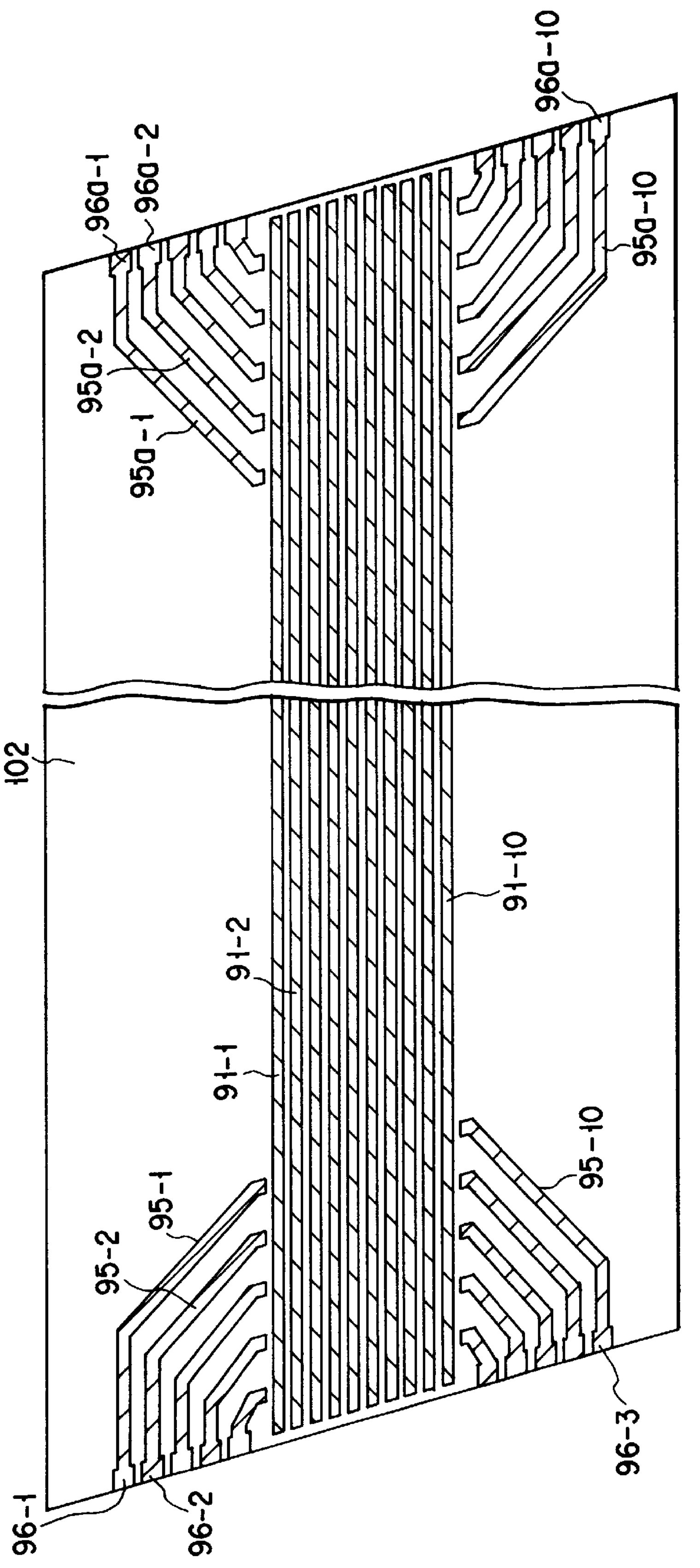
FIG. 21 is a plan view for explaining a method of manufacturing the head chips of the electrostatic recording head according to the third embodiment, in which the first step of the method is illustrated.
Figure 22:
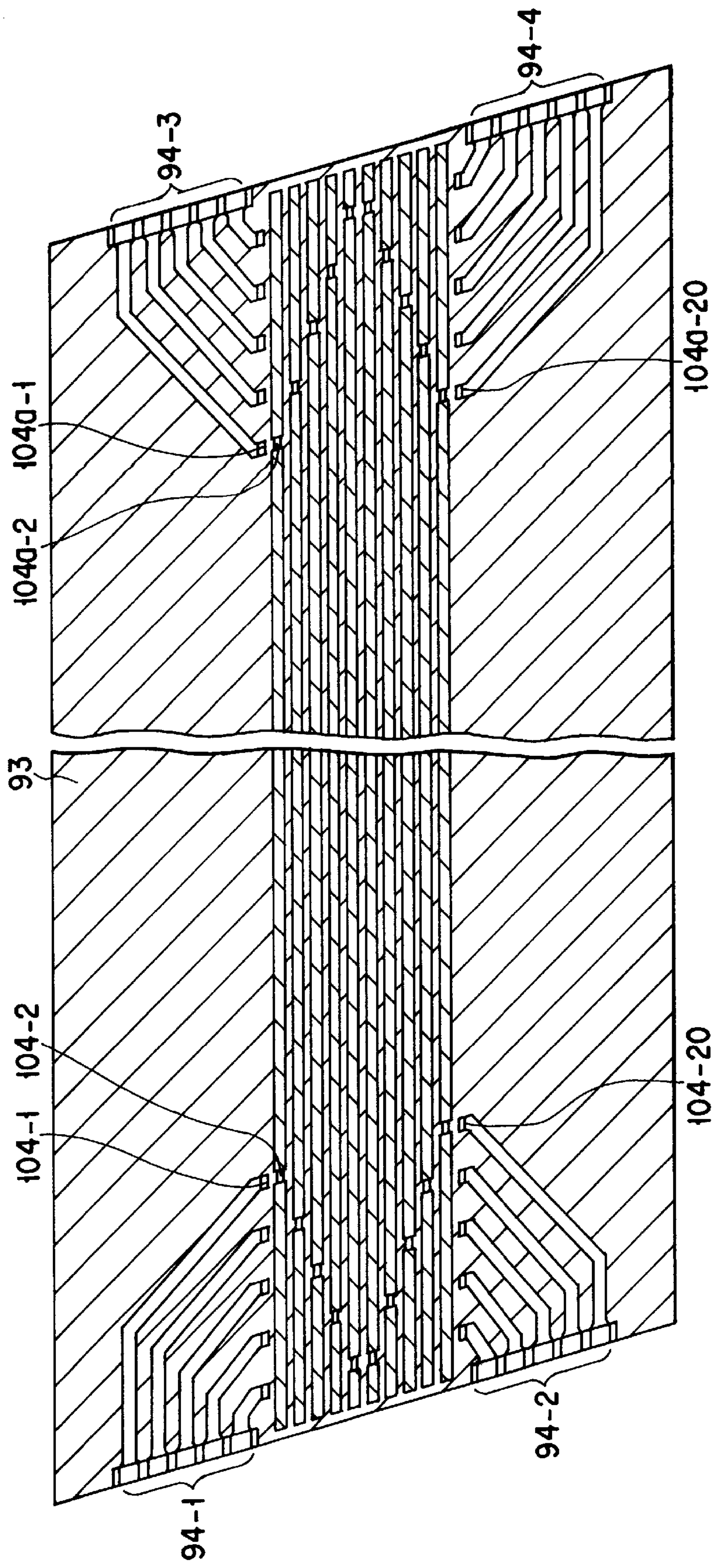
FIG. 22 is a plan view for explaining the second step of the method.
Figure 23:
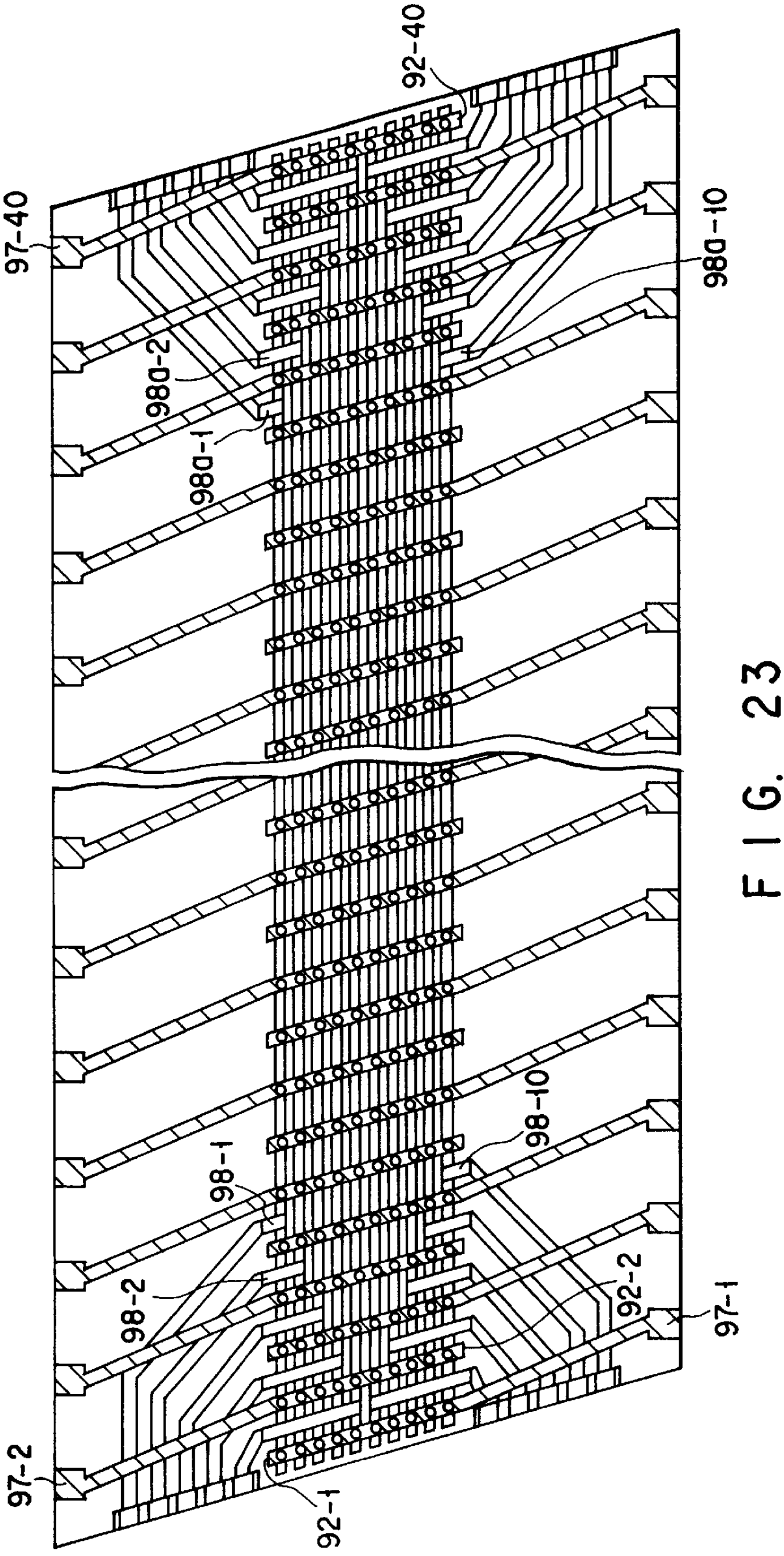
FIG. 23 is a plan view for explaining the third step of the method.
Figure 24:
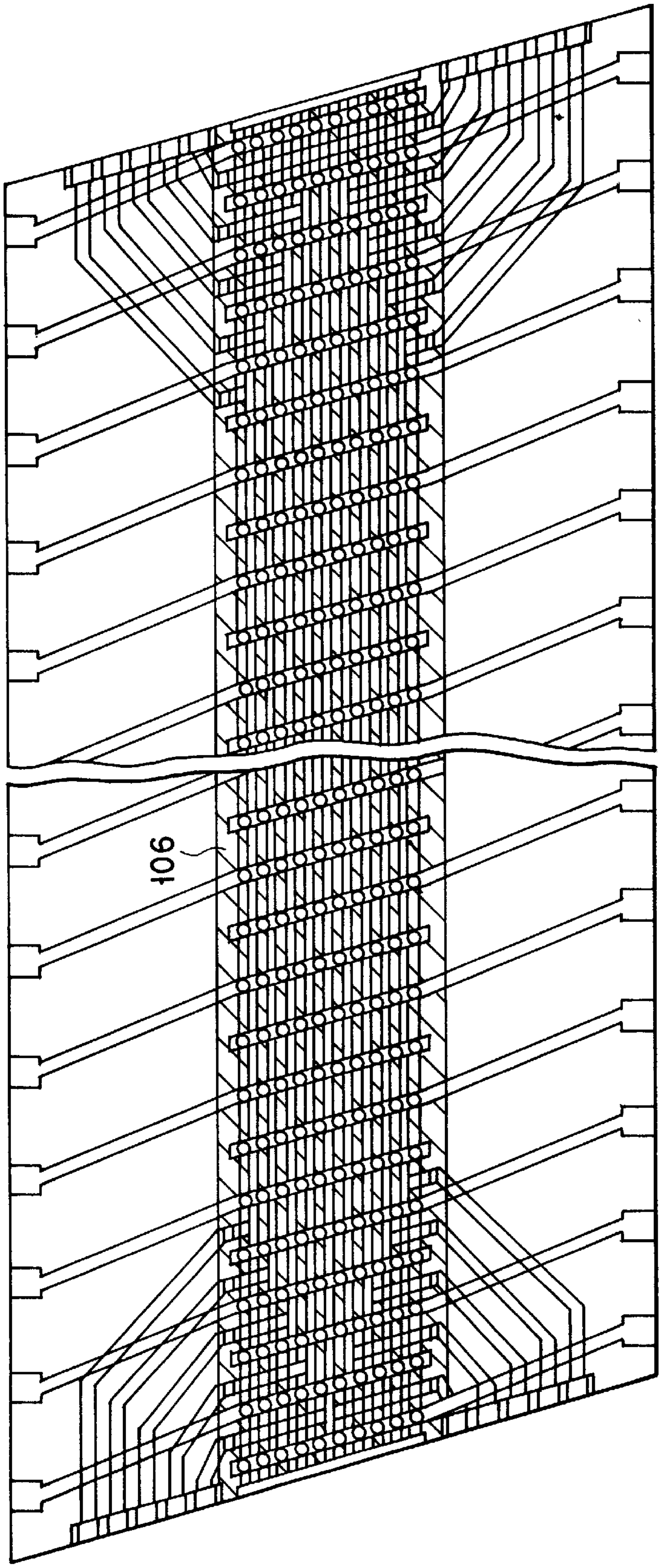
FIG. 24 is a plan view for explaining the fourth step of the method.
Figure 25:
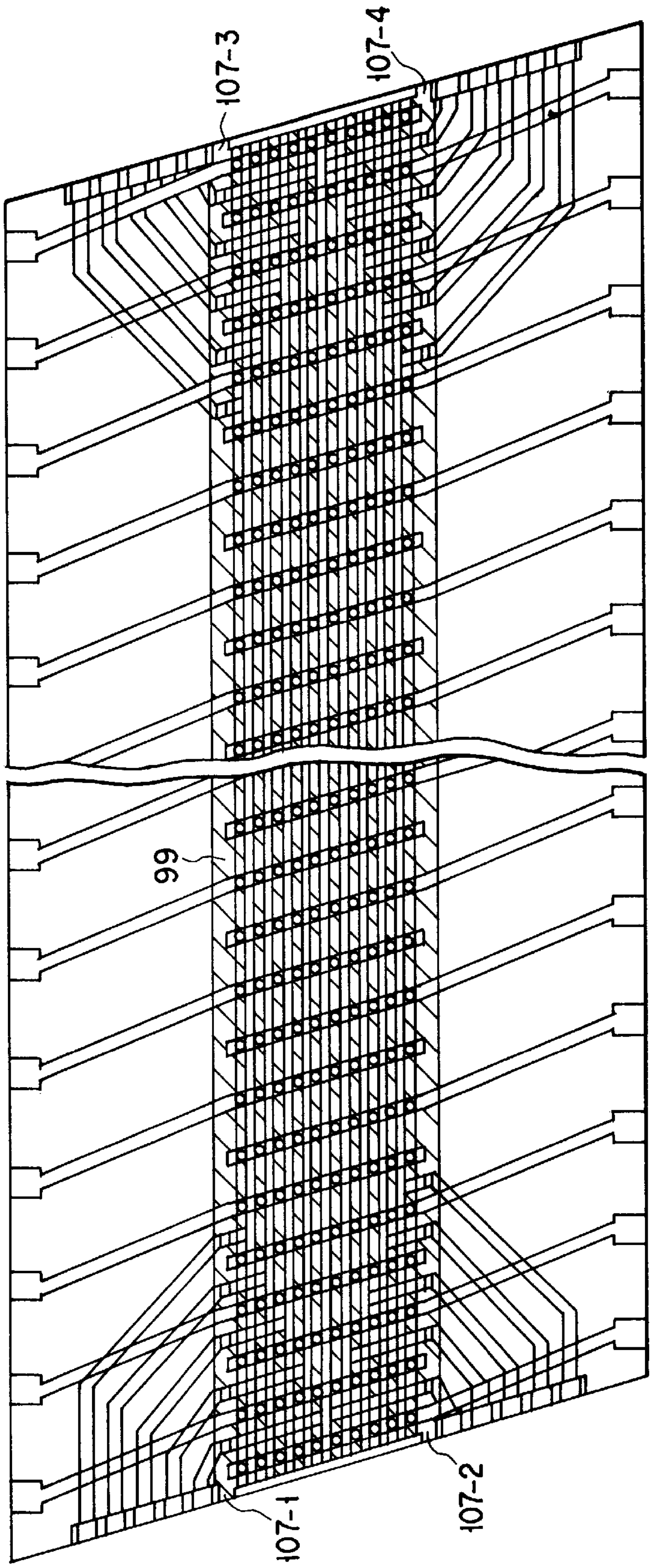
FIG. 25 is a plan view for explaining the fifth step of the method.

The head chip manufacturing method of this embodiment is as follows. First, an aluminum conductor layer (1 μm thick) is formed by sputtering on a head chip base 102 made of quartz glass (0.5 mm thick). The aluminum conductor layer is then etched to form desired induction electrode patterns 91-1, 91-2, . . . , 91-10, connecting patterns 95-1, 95-2, . . . , 95-10 and 95*a*-1, 95*a*-2, . . . , 95*a*-10 whose ends are located near the outside induction electrode lines 91-1 and 91-10, and interconnecting portions 96-1, 96-2, . . . , 96-10 and 96*a*-1, 96*a*-2, . . . , 96*a*-10 in the other ends of the connecting patterns in the end portions of a head chip (FIG. 21). On top of the resultant structure, a silicon oxide dielectric layer 93 (5 μm thick) is applied by plasma polymerization and partially etched away so as to expose four induction electrode interconnecting regions 94-1 to 94-10 and small windows 104-1, 104-2, . . . , 104-10 and 104*a*-1, 104*a*-2, . . . , 104*a*-10 for connecting the connecting patterns, extracting patterns, and the induction electrodes (FIG. 22). A titanium conductor layer (1.5 μm thick) is formed on the dielectric layer by sputtering, and its unnecessary portions are removed by etching to form discharge electrode patterns 92-1, 92-2, . . . , 92-40 having charged particle generation holes and connecting terminals 97-1, 97-2, . . . , 97-10. At the same time, extracting patterns 98-1, 98-2, . . . , 98-10 and 98*a*-1, 98*a*-2, . . . , 98*a*-10 also are formed (FIG. 23). Thereafter, the entire region of a head chip is coated with an insulating polyimide layer (150 μm thick) by spin coating. The polyimide is hardened and etched to form charged particle passing holes and remove the parts of the coating from connecting terminals and its vicinities of the discharge electrodes and end regions, thereby forming an insulator layer 106 (FIG. 24). Subsequently, a liquid resist ink is filled in the charged particle passing holes formed in the insulator layer, and is hardened to planarize the overall surface of the insulator layer. A titanium conductor layer (1.5 μm thick) is again formed on the resultant structure by sputtering and etched to form a control electrode 99 having an outer shape pattern and charged particle radiation holes (FIG. 25). Simultaneously, interconnecting portions 107-1 to 107-4 for interconnecting control electrodes of adjacent head chips also are formed in the end portions of the control electrode. Finally, a resist removing agent is injected through the radiation holes in the control electrode to remove the hardened resist ink filled in the holes of the insulator layer, thereby completing a head chip.

This embodiment with the above arrangement has characteristic features similar to those of the first embodiment. That is, no large manufacturing installation is necessary in the manufacture of a recording head, a recording head with a large length can be easily manufactured, the resolution, the durability, and the uniformity of a recording head can be improved by the use of the thin-film manufacturing technology, and a recording head can be manufactured by head chips of the same kind. This embodiment further has the following advantages. Unlike the first embodiment, interconnection of induction electrodes between the adjacent head chips or connection to induction electrodes of a head chip in the end portion of an array need not be performed in a space in which the array pitch of induction electrodes is narrow. Accordingly, various electrical connecting means such as coating of a conductive paste in this embodiment can be used, and a connecting process can be performed reliably and easily. Also, the arrangement and size of these connecting portions can be freely set in the end portion of a head chip. Therefore, even when the resolution of a recording head is increased, connection or interconnection can be reliably performed by a simple method. Since connecting patterns and extracting patterns are formed simultaneously with the formation of the induction electrodes or the discharge electrodes in the same step, it is possible to avoid complicating the manufacturing steps.

Figure 26:
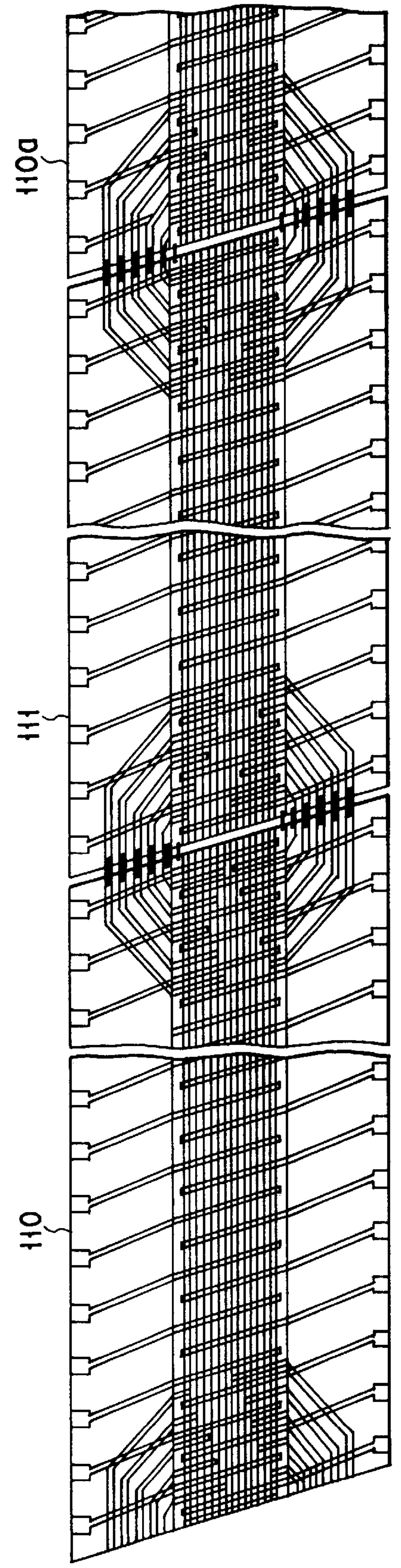
FIG. 26 is a plan view showing an electrostatic recording head using two different types of head chips according to the fourth embodiment of the present invention.

The fourth embodiment of the present invention will be described below with reference to FIG. 26.

This embodiment makes use of a method of manufacturing a recording head by alternately arranging two different types of head chips different in the arrangement of induction electrode extracting patterns, instead of the method of manufacturing a recording head by using head chips of the same kind in the third embodiment shown in FIG. 18. Therefore, only a method of arranging extracting patterns, which is different from the method of the third embodiment, will be described below. Referring to FIG. 26, a recording head consists of two head chips 110 and 110*a* of the same kind and one head chip 111 different only in the arrangement of extracting patterns from the head chips 110 and 110*a*. The array of head chips and the method of interconnecting induction electrodes and control electrodes are identical with those in the third embodiment.

Figure 27:
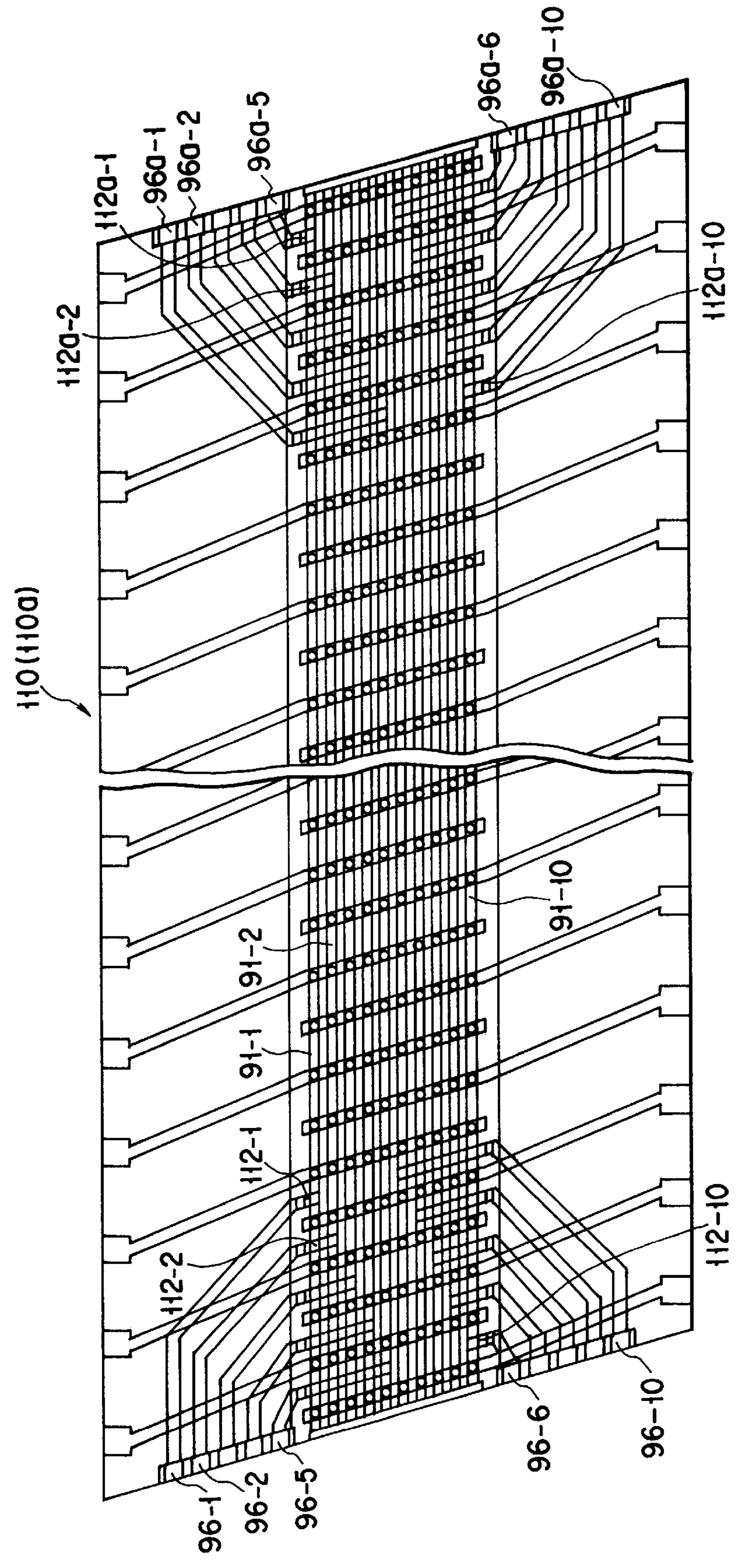
FIG. 27 is a plan view showing a head chip of one type of electrostatic recording head according to the fourth embodiment.
Figure 28:
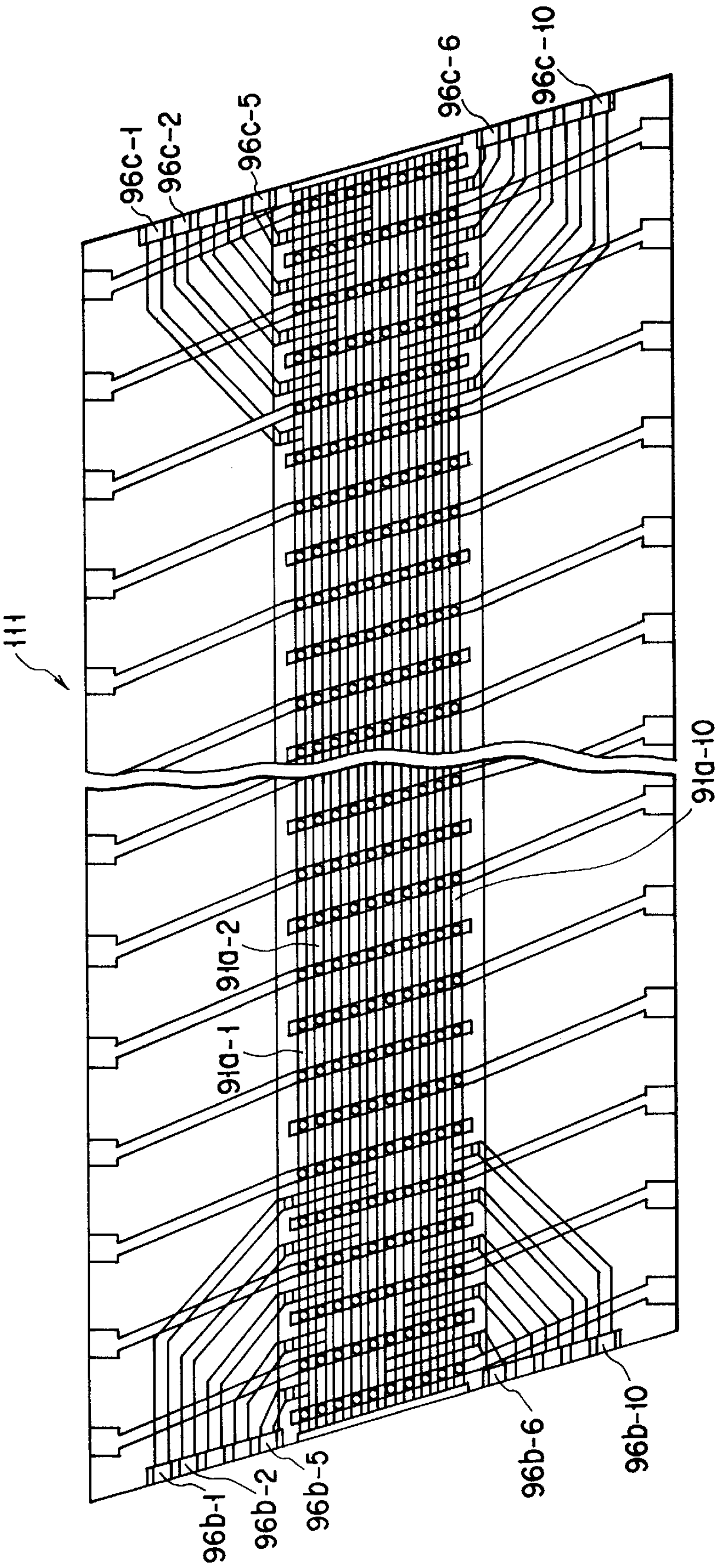
FIG. 28 is a plan view showing a head chip of the other type of electrostatic recording head according to the fourth embodiment.

The two different types of head chips of this embodiment are illustrated in FIGS. 27 and 28. In FIGS. 27 and 28, the same reference numerals as in the third embodiment denote the same components of the recording head. Referring to FIG. 27, induction electrode extracting patterns 112-1, 112-2, . . . , 112-10 in one end portion of the head chip 110 (110*a*) are so arranged that induction electrode interconnecting portions 96-1, 96-2, . . . , 96-5 and 96-6, . . . , 96-10 of the induction electrodes are connected to induction electrodes 91-1, 91-2 . . . , 91-5 and 91-10, . . . , 91-6, respectively. In the other end portion of the head chip, extracting patterns 112*a*-1, 112*a*-2, . . . , 112*a*-10 are so arranged that induction electrode interconnecting portions 96*a*-1, 96*a*-2, . . . , 96*a*-5 and 96*a*-6, . . . , 96*a*-10 are connected to induction electrodes 91-5, 91-4, . . . , 91-1 and 91-6, . . . , 91-10, respectively. Consequently, the extracting patterns and the connecting patterns connecting with the individual induction electrodes are inverted in units of five induction electrodes on the two sides of the head chip.

The same method of arrangement as in FIG. 27 is applied to the other type of the head chip shown in FIG. 28. In one end portion of the head chip, induction electrode interconnecting portions 96*b*-1, 96*b*-2, . . . , 96*b*-5 and 96*b*-6, . . . , 96*b*-10 are so arranged as to be connected to induction electrodes 91*a*-5, 91*a*-4, . . . , 91*a*-1 and 96*a*-6, . . . , 96*a*-10, respectively. In the other end of the head chip, interconnecting portions 96*c*-1, 96*c*-2, . . . , 96*c*-5 and 96*c*-6, . . . , 96*c*-10 are so arranged as to be connected to induction electrodes 91*a*-1, 91*a*-2, . . . , 91*a*-5 and 91*a*-10, . . . , 91*a*-6, respectively.

When these head chips are alternately arranged, the interconnecting portions opposing each other in the boundary between the head chips are connected to induction electrodes arranged in the same locations on these head chips. Additionally, in each head chip the extracting patterns and the connecting patterns of individual electrodes are rotation-symmetrical about the center of the head chip, and this eliminates the directionality of the head chip.

In this embodiment with the above arrangement, the induction electrodes can be interconnected by alternately arranging the two different types of head chips and electrically connecting the interconnecting portions described above. In this interconnection process, the long and short extracting patterns and connecting patterns connecting with the induction electrodes are switched in the respective end portions of the two head chips. Accordingly, in a recording head in which a plurality of head chips are interconnected, a plurality of sets of interconnected induction electrodes have a uniform total length. This results in a uniform load impedance and uniformizes the radiation amount of charged particles in the recording head. This effect is particularly remarkable when a recording head with a large length is manufactured by using a large number of head chips.

The fifth embodiment of the present invention will be described below with reference to FIG. 29.

An electrostatic recording head of this embodiment is constructed by four head chips having parameters similar to those in the first embodiment. This embodiment differs from the first embodiment in a method of interconnecting induction electrodes and control electrodes between head chips and a method of connection for supplying power to a head chip in the end portion of an array. FIG. 29 illustrates an overall recording head and a portion of wiring patterns of a circuit board surrounding the recording head.

Figure 29:
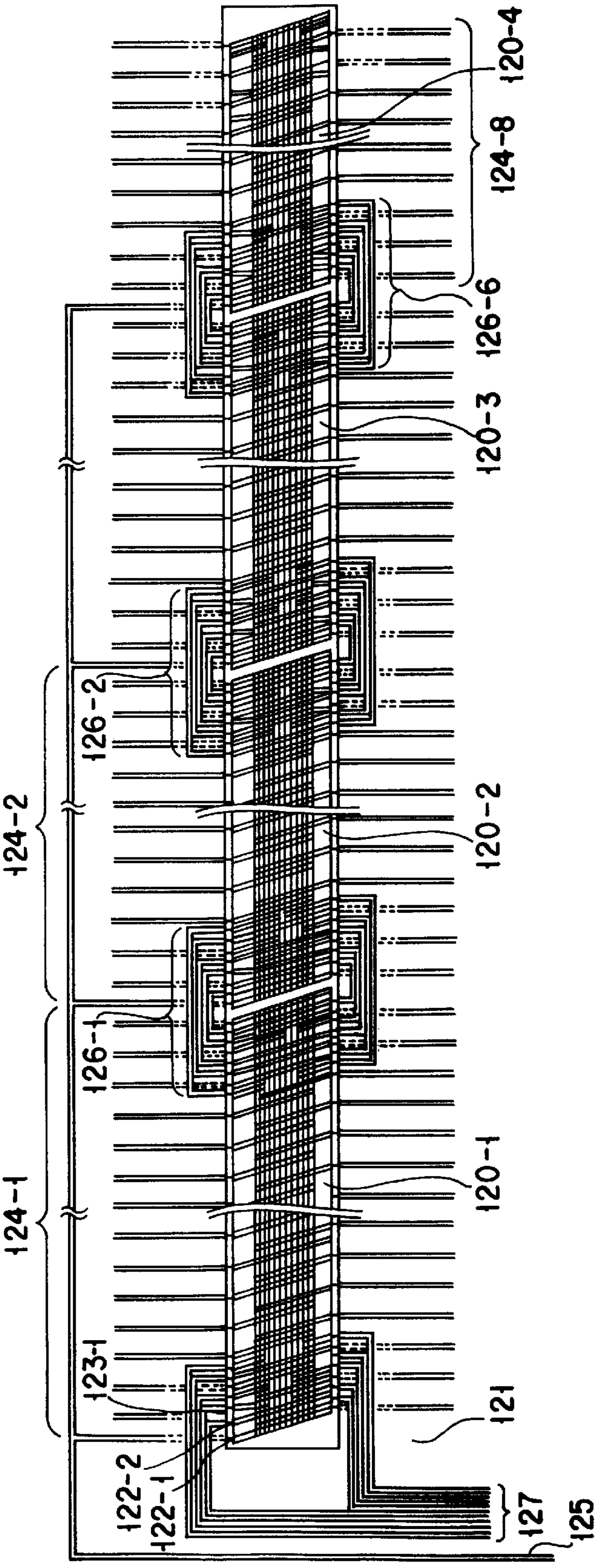
FIG. 29 is a plan view showing an electrostatic recording head according to the fifth embodiment of the present invention.

In FIG. 29, reference numerals 120-1 to 120-4 denote four head chips of the same kind constituting the recording head. These head chips are arranged along the longitudinal direction with a predetermined array accuracy so that the chips together operate as a single recording head. Connecting terminals for supplying power to induction electrodes, discharge electrodes, and a control electrode are arranged in side portions along the longitudinal direction of each head chip. A circuit board 121 is arranged adjacent to the recording head so as to surround the recording head. Power terminals 122-1, 122-2, . . . , corresponding to the connecting terminals of the head chips are formed on the inner periphery of the circuit board opposing the recording head. The connecting terminals and the power terminals are electrically connected by welding thin metal wires 123-1, 123-2, . . . , by wire bonding. On the circuit board, power supply patterns 124-1, 124-2, . . . , 124-8 connected to the power terminals to supply power to the discharge electrodes and a power supply pattern 125 for supplying power to the control electrode are formed. Also, interconnecting patterns 126-1, 126-2, . . . , 126-6 connected to the power terminals arranged in the vicinities of opposing portions of adjacent head chips to linearly interconnect the induction electrodes between the head chips are formed on the circuit board. A power supply pattern 127 for supplying power to the induction electrodes is formed from the power terminals connected to the head chip in the end portion of the array. These power supply patterns on the circuit board are connected to a recording head driver/controller (not shown) and supply power to the individual electrodes of the head chips constituting the recording head.

Figure 30:
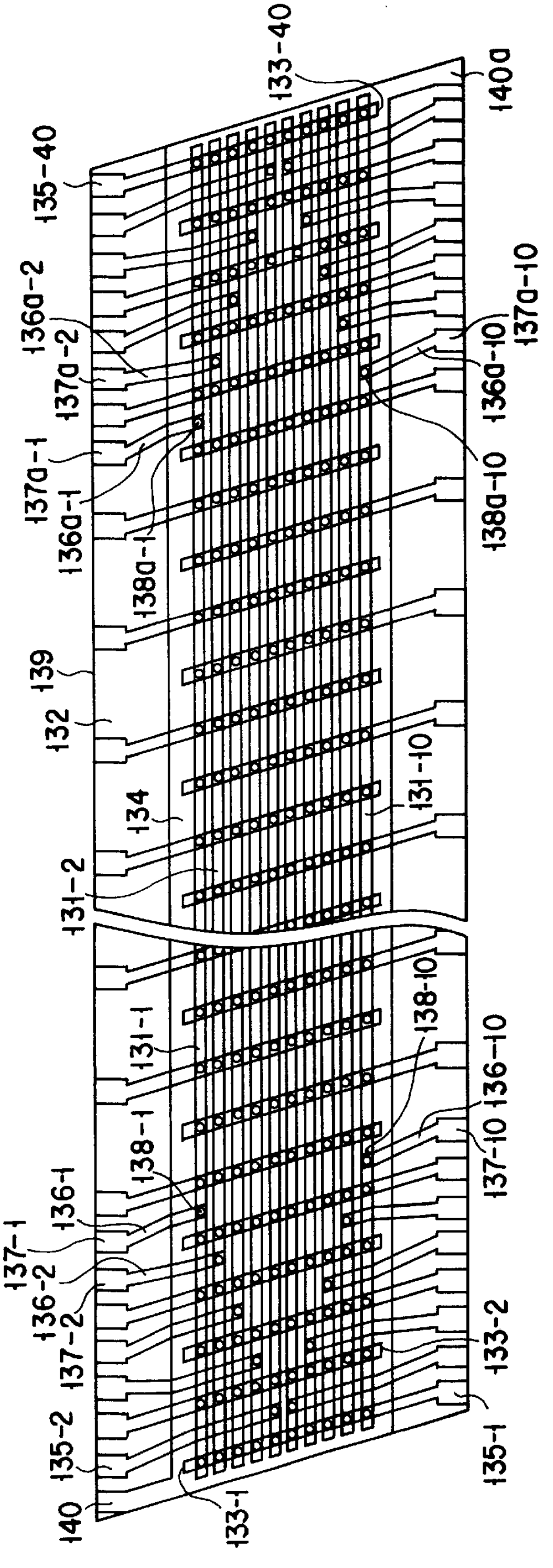
FIG. 30 is a plan view showing a head chip of the electrostatic recording head according to the fifth embodiment.

The arrangement of the head chip of this embodiment is illustrated in FIG. 30. In FIG. 30, reference numerals 131-1, 131-2, . . . , 131-10 denote ten induction electrodes formed on a head chip base 139. These induction electrodes extend to the vicinities of the end portions in the longitudinal direction of the head chip. Forty discharge electrodes 133-1, 133-2, . . . , 133-40 are formed by repeating the same pattern on the induction electrodes via a dielectric layer 132. These discharge electrodes and the induction electrodes together form a matrix. The discharge electrodes are connected to discharge electrode connecting terminals 135-1, 135-2, . . . , 135-40 arranged in the side portions of the head chip along the extending direction of the discharge electrodes.

Induction electrode extracting patterns 136-1, 136-2, . . . , 136-10 and 136*a*-1, 136*a*-2, . . . , 136*a*-10 are formed between the discharge electrodes arranged in the vicinities of the two end portions in the longitudinal direction of the head chip. These extracting patterns extend parallel to the extending direction of the discharge electrodes from intersections with the respective corresponding induction electrodes and connect with discharge electrode connecting terminals 137-1, 137-2, . . . , 137-10 and 137*a*-1, 137*a*-2, . . . , 137*a*-10 arranged in the side portions of the head chip. These extracting patterns are made from the same conductor layer as the discharge electrodes simultaneously with the formation of the discharge electrodes.

A dielectric layer between the induction electrodes and the discharge electrodes is stacked all over the head chip except for small windows 138-1 to 138-10 and 138*a*-1 to 138*a*-10 for connection formed in the intersections of the extracting patterns and the induction electrodes. The induction electrodes and the extracting patterns are electrically connected through the small windows in the dielectric layer by the same method as in the third embodiment.

A control electrode 134 having charged particle radiation holes is formed on the discharge electrodes via an insulator layer (not shown). This control terminal is connected to control electrode connecting terminals 140 and 140*a* formed on the end portions of the head chip. The above electrode patterns, extracting patterns, and connecting terminals are so arranged as to be rotation-symmetrical about the center of the head chip. This eliminates the directionality of the head chip upon inversion through 180°.

This embodiment with the above arrangement has the following characteristic features compared to the recording head of the first embodiment.

Interconnection of the induction electrodes between adjacent head chips and electrical connection for supplying power to the induction electrodes need not be performed in a narrow region in which the induction electrodes are arranged; that is, the interconnection and the power supply of the induction electrodes can be realized by connecting the head chips and the circuit board. This greatly simplifies the work of connection. Also, the same connection method is applicable even when the resolution of the recording head is increased.

This embodiment also has the following advantage compared to the recording head of the third embodiment. That is, the head chip can be decreased in size because no region for interconnecting induction electrodes needs to be formed in the end portions of the head chip. This improves the manufacturing efficiency and miniaturizes the recording head. Furthermore, the work can be simplified because no connecting process is necessary between the head chips.

Figure 31:
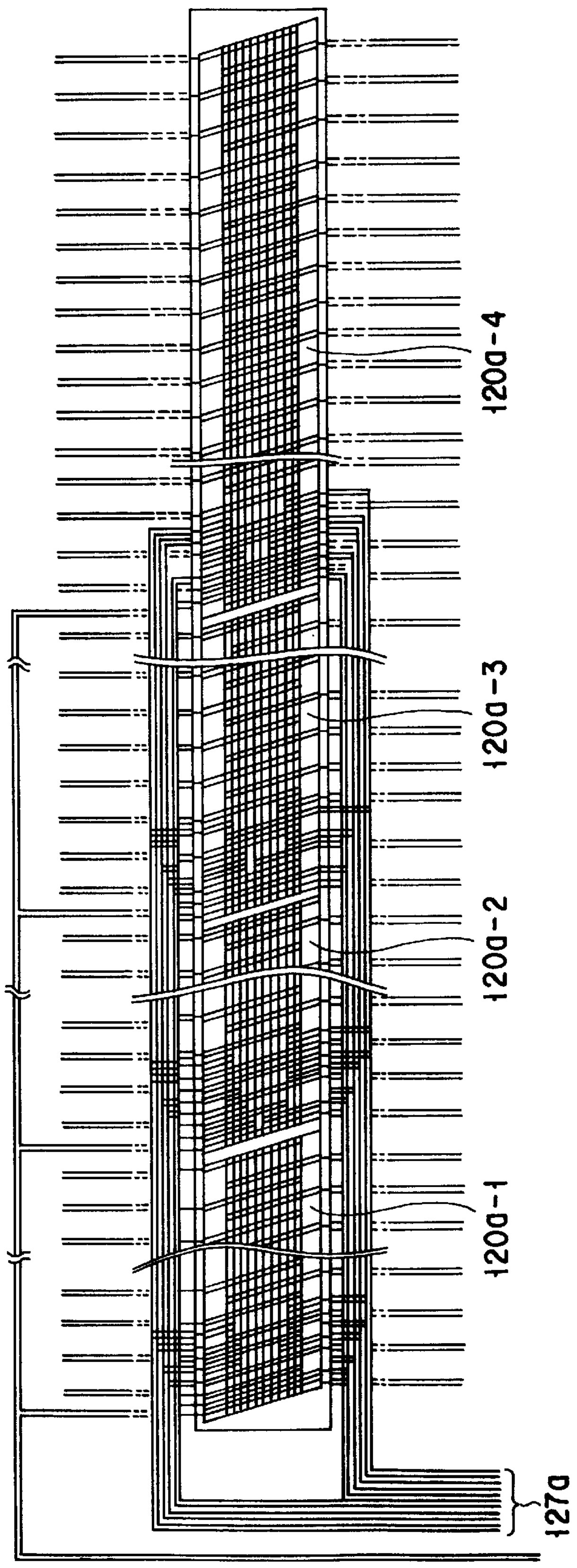
FIG. 31 is a plan view for explaining a modification of wiring patterns of a circuit board for supplying power to the electrostatic recording head according to the fifth embodiment.

In this embodiment, the wiring patterns on the circuit board for supplying power to the recording head can be altered as illustrated in FIG. 31. In this arrangement shown in FIG. 31, a bus-line power supply pattern 127*a* is used as the power supply pattern for the induction electrodes, and power is supplied parallel from the bus lines to the induction electrodes of individual head chips. With this arrangement, an increase in the total length of the induction electrodes in the recording head can be prevented. It is also possible to suppress an increase in the load impedance during driving since power is supplied to head chips 120*a*-1 to 120*a*-4 at the shortest distance from the bus lines. Furthermore, since induction electrode extracting patterns need to be formed only in one end portion of each head chip, the structure of the head chip is simplified. Since this also reduces the number of portions at which the head chips and the circuit board are electrically connected, it is possible to shorten the process of manufacture or assembly. Accordingly, this arrangement is assumed to be effective when a recording head is constituted by a large number of head chips or a recording head with a large length is manufactured.

Figure 32:
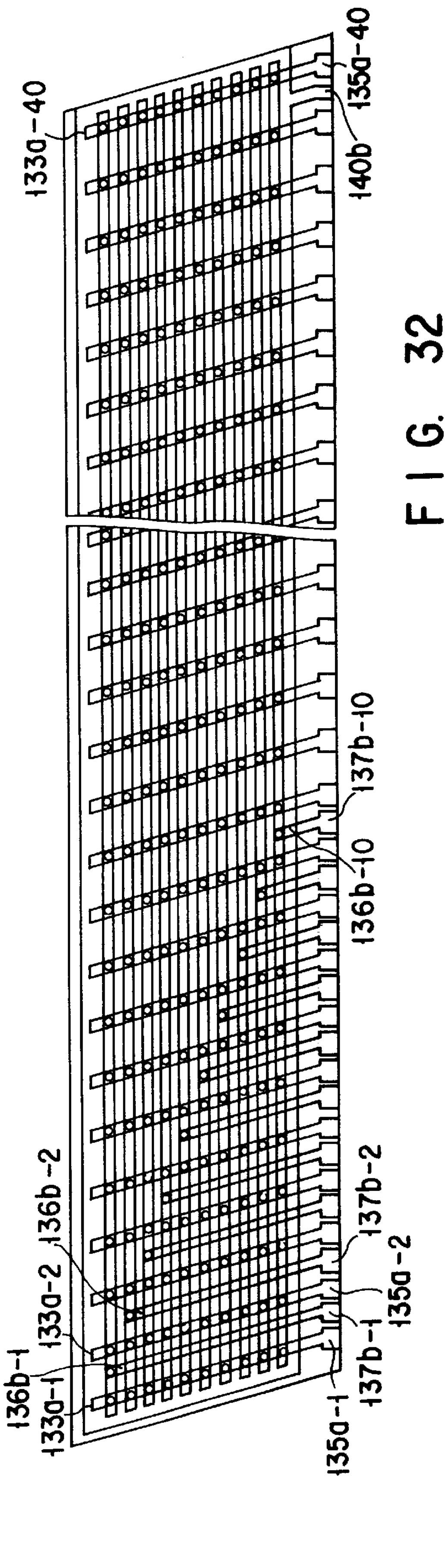
FIG. 32 is a plan view for explaining a modification of the head chip of the electrostatic recording head according to the fifth embodiment.

This embodiment can also be practiced by altering the head chip as illustrated in FIG. 32. In this head chip shown in FIG. 32, discharge electrodes 133*a*-1, 133*a*-2, . . . , 133*a*-40 and extracting patterns 136*b*-1, 136*b*-2, . . . , 136*b*-10 of induction electrodes extend toward one side portion along the longitudinal direction of the head chip, and connecting terminals 135*a*-1, 135*a*-2, . . . , 135*a*-40 and 137*b*-1, 137*b*-2, . . . , 137*b*-10 for supplying power to these electrodes and a connecting terminal 140*b* for a control electrode are arranged in this side portion.

When the head chip of this embodiment is formed as described above, the connecting terminals of the individual electrodes are arranged in one side portion of the head chip, and so the head chip can be miniaturized to a size close to the size of an array of induction electrodes. Consequently, a head chip with the smallest size in the embodiments of the present invention is realized. Also, since a circuit board for supplying power to the individual electrodes needs to be arranged only in one side portion opposing the above side portion of the recording head, the overall recording head including the circuit board can be miniaturized.

Figure 34:
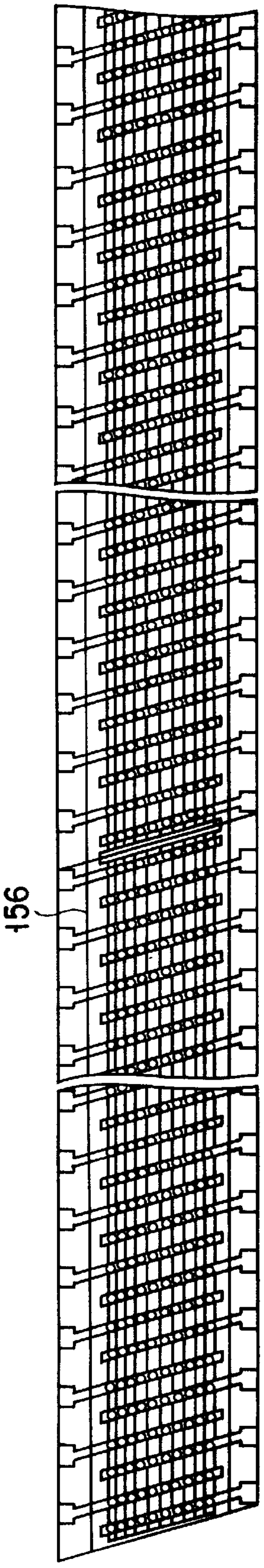
FIG. 34 is a plan view for explaining the second step of the manufacturing method of the sixth embodiment.
Figure 35:
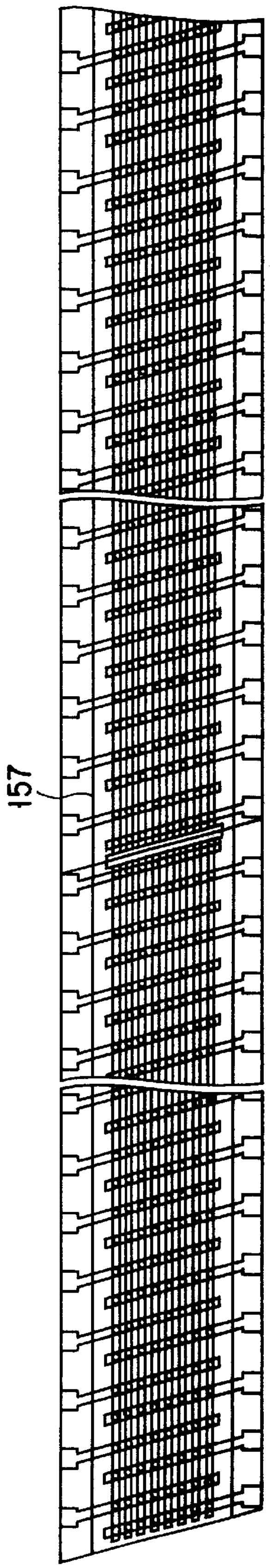
FIG. 35 is a plan view for explaining the third step of the manufacturing method of the sixth embodiment.

The sixth embodiment of the present invention will be described below with reference to FIGS. 33 to 35.

In this embodiment, of the members constituting an electrostatic recording head, the members constituting a charged particle generating section, i.e., induction electrodes, a dielectric layer, and discharge electrodes are formed on a head chip by using a thin-film manufacturing technology. A charged particle control section stacked on the charged particle generating section and consisting of an insulator layer and a control electrode is formed by integrally bonding and stacking an insulating film and discrete control electrodes.

Figure 33:
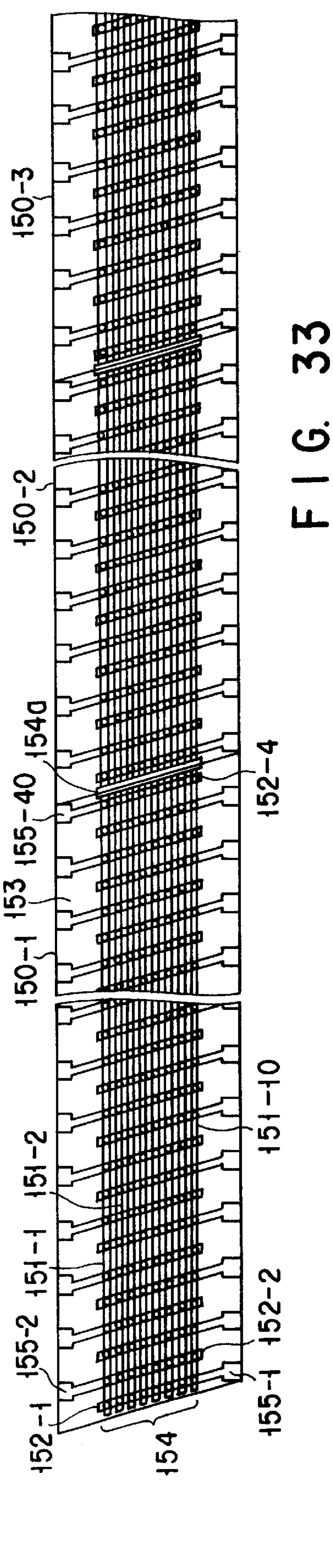
FIG. 33 is a plan view for explaining a method of manufacturing an electrostatic recording head according to the sixth embodiment of the present invention, in which the first step of the method is illustrated.

FIG. 33 shows a charged particle generating section in a substantially half region of the recording head of this embodiment constructed by four head chips. In FIG. 33, reference numerals 150-1, 150-2, and 150-3 denote head chips of the same kind constituting the charged particle generating section of the recording head. These head chips are arranged in a line in the longitudinal direction of the recording head. Each head chip has the same arrangement as the charged particle generating section of the head chip of the first embodiment. That is, ten induction electrodes 151-1, 151-2, . . . , 151-10 and 40 discharge electrodes 152-1, 152-2, . . . , 152-40 having charged particle generation holes are arranged in a matrix manner via a dielectric layer 153. Both end portions 154*a* of the head chip are not covered with the dielectric layer, and so the induction electrodes are exposed in these portions. The discharge electrodes are connected to connecting terminals 155-1, 155-2, . . . , 155-40 for power supply in the end portions of the head chip in the extending direction of the discharge electrodes. This head chip with the above arrangement is manufactured by forming and stacking the electrodes and the dielectric layer on a head chip base by using a thin-film manufacturing technology.

As in the first embodiment, the exposed portions of the induction electrodes of the adjacent head chips are electrically connected by thin metal wires by using wire bonding between the opposing portions of these head chips and encapsulated with an insulating resin. In this manner all induction electrodes constituting the head chips of the recording head are interconnected to form an integrated electrode.

The entire region of the recording head in which these head chips are arranged and connected is coated with a photosensitive insulating film with a predetermined thickness by using a vacuum laminating method. The film is then exposed and etched into a desired pattern, charged particle passing holes are formed, and portions of the film on connecting terminals of the discharge electrodes are removed, thereby completing an insulator layer 156 (FIG. 34). A control electrode 157 manufactured by electroforming and having a length corresponding to the overall length of the recording head is bonded and stacked on the insulator layer. In this way the recording head of this embodiment is completed (FIG. 35).

This embodiment with the above arrangement has the following characteristic features compared to the arrangements and the manufacturing methods of conventional electrostatic recording heads and the first to fifth embodiments.

Of the components of the recording head, the induction electrodes, the dielectric layer, and the discharge electrodes constituting the charged particle generating section are formed on the head chip by a thin-film manufacturing technology. Accordingly, as in the first to fifth embodiments, the charged particle generating section can be manufactured with a higher accuracy than in the conventional recording heads. Also, since a solid-state stacked structure can be obtained, it is possible to reduce variations in the charged particle generation amount in the recording head and improve the durability of the charged particle generating section. Additionally, since the recording head is constituted a plurality of by head chips, it is possible to fully utilize the advantages of the thin-film technology without being restricted by the manufacturing installation corresponding to the size of the recording head. On the other hand, the insulator layer requiring a long processing time in the thin-film manufacturing technology is integrally formed all over the recording head by adhering an insulating film. Accordingly, the range of use of the thin-film technology is minimized compared to the first to fifth embodiments, and this reduces the recording head manufacturing period.

Although the present invention has been explained by the embodiments described above, the invention is not limited to the combinations in these embodiments. That is, it is possible to variously combine the method of splitting a recording head, the range of recording head components formed on a head chip, the method of interconnecting split electrodes, and the method of fixing a head chip. Also, the resolution and the recording size of a recording head, the numbers of induction electrodes and discharge electrodes, the head chip size, the electrode arrangement, and the film formation method and the materials to be used in a thin-film manufacturing technology are not particularly limited to those in the above embodiments. That is, optimum methods and arrangements can be combined by taking account of the recording width and a necessary resolution of an electrostatic recording head to be manufactured, the size of the recording head, the maximum processing size of a thin-film manufacturing installation for manufacturing head chips, applicable connection methods, and the length of a processing period.

In the present invention as has been described above, an electrostatic recording head is constituted by an array of a plurality of head chips. Accordingly, it is readily possible to manufacture a long electrostatic recording head meeting a large size.

Also, by changing the size or the number of head chips to be arranged, electrostatic recording heads meeting various recording sizes can be manufactured by head chips of the same kind. Consequently, various recording heads can be manufactured without largely changing the method of manufacture.

Additionally, the advantages of a thin-film arrangement can be incorporated into an electrostatic recording head by using a thin-film manufacturing technology in the manufacture of head chips. It is also possible to eliminate the limitations on the manufacturing size of an electrostatic recording head by the processing capacity of a thin-film manufacturing installation.

Furthermore, head chips constituting an electrostatic recording head can have a size suited to the processing capacity of a manufacturing installation. This facilitates the manufacture and also improves the manufacturing efficiency.

In the present invention, in manufacturing an electrostatic recording head by using an array of head chips, various methods can be selected as a method of splitting the recording head into head chips or a method of interconnecting electrodes split between the head chips. Accordingly, an optimum electrostatic recording head can be obtained by taking into account the resolution, the electrode arrangement, and the recording width of the electrostatic recording head, and applicable interconnecting and manufacturing methods.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An electrostatic recording head comprising:

a plurality of elongated head chips linearly aligned in a longitudinal direction, each of said head chips having first and second parallel ends between which said head chips longitudinally extend, and each of said head chips including:

an elongated dielectric layer extending in said longitudinal direction, said dielectric layer having a first surface and a second surface opposing the first surface;

a plurality of line electrodes provided on the first surface of said dielectric layer, said line electrodes also extending in said longitudinal direction, and said line electrodes being spaced apart from each other at predetermined intervals; and a plurality of finger electrodes formed on the second surface of said dielectric layer, said finger electrodes being arranged to cross said line electrodes so that said finger electrodes and said line electrodes form a matrix; and an electrical connection between corresponding line electrodes of adjacent ones of said head chips; and wherein said electrical connection comprises:

a plurality of leads including a plurality of connecting lines formed on the first surface of said dielectric layer and a plurality of extracting lines formed on the second surface of said dielectric layer, each of said connecting lines having a first end located near said line electrodes and a second end located near one of the first and second ends of said head chips, and each of said extracting lines having a first end electrically connected to a corresponding line electrode through said dielectric layer and a second end electrically connected to the first end of a corresponding connecting line through said dielectric layer; and a plurality of connecting wires for electrically connecting corresponding leads of said adjacent ones of said head chips.

2. The recording head according to claim 1, wherein said leads have substantially identical impedances.

3. The recording head according to claim 2, wherein said leads have substantially identical dimensions.

4. The recording head according to claim 2, wherein said leads have lengths and widths set to achieve said substantially identical impedances, said widths being set in accordance with different lengths of said leads.

5. The recording head according to claim 1, wherein said leads have substantially identical dimensions.

* * * * *